(12) United States Patent
Sato et al.

(10) Patent No.: US 7,963,435 B2
(45) Date of Patent: *Jun. 21, 2011

(54) METHOD OF FORMING BONDED BODY AND BONDED BODY

(75) Inventors: Mitsuru Sato, Suwa (JP); Takatoshi Yamamoto, Suwa (JP)

(73) Assignee: Seiko Epson Corporation (JP)

( * ) Notice: Subject to any disclaimer, the term of this patent is extended or adjusted under 35 U.S.C. 154(b) by 30 days.

This patent is subject to a terminal disclaimer.

(21) Appl. No.: 12/358,689

(22) Filed: Jan. 23, 2009

(65) Prior Publication Data

US 2009/0186215 A1 Jul. 23, 2009

(30) Foreign Application Priority Data

Jan. 23, 2008 (JP) ................................. 2008-013202

(51) Int. Cl.
*B23K 31/02* (2006.01)
(52) U.S. Cl. .................. 228/225; 228/233.1; 228/233.2; 228/254
(58) Field of Classification Search ........................ None
See application file for complete search history.

(56) References Cited

U.S. PATENT DOCUMENTS

| | | | |
|---|---|---|---|
| 3,203,084 A | | 8/1965 | Best |
| 4,269,641 A | * | 5/1981 | Ebata et al. ................. 156/89.28 |
| 4,500,383 A | * | 2/1985 | Kashiwagi et al. ............ 156/285 |
| 4,624,404 A | * | 11/1986 | Ohmae et al. .................. 228/198 |
| 4,763,828 A | * | 8/1988 | Fukaya et al. .............. 228/124.1 |
| 4,963,828 A | * | 10/1990 | Kawame et al. .............. 324/404 |
| 5,125,557 A | | 6/1992 | Tanaka et al. |
| 5,425,494 A | * | 6/1995 | Rosenthal et al. .......... 228/124.5 |
| 5,490,627 A | * | 2/1996 | Krum et al. ................. 228/124.1 |
| 5,632,438 A | | 5/1997 | Hoffmeyer et al. |
| 5,746,367 A | | 5/1998 | Pai et al. |
| 5,985,125 A | | 11/1999 | Kim |

(Continued)

FOREIGN PATENT DOCUMENTS

JP 60-200960 10/1985

(Continued)

*Primary Examiner* — Kiley Stoner
(74) *Attorney, Agent, or Firm* — Harness, Dickey & Pierce, P.L.C.

(57) ABSTRACT

A method of forming a bonded body comprised of a first base member, a second base member, and a first bonding film and a second bonding film provided between the first base member and the second base member is provided. The first bonding film and the second bonding film are constituted of copper and an organic component, and an amount of copper contained in each of the first bonding film and the second bonding film is 90 atom % or higher but lower than 99 atom % at an atomic ratio. The method is comprised of: forming the first bonding film on the first base member by using a chemical vapor-film formation method; forming the second bonding film on the second base member by using a chemical vapor-film formation method; bringing the first bonding film formed on the first base member into contact with the second bonding film formed on the second base member so that the first bonding film faces the second bonding film; and applying a compressive force to the first base member and the second base member so that the first bonding film and the second bonding film are bonded together to thereby obtain the bonded body. Two base members can be firmly and efficiently bonded together with high dimensional accuracy at a low temperature, and the two base members can be efficiently separated (peeled off) to each other after use of the bonded body. Further, a bonded body is also provided.

16 Claims, 8 Drawing Sheets

U.S. PATENT DOCUMENTS

| | | | |
|---|---|---|---|
| 6,106,960 A * | 8/2000 | Fujii et al. | 428/627 |
| 6,207,522 B1 * | 3/2001 | Hunt et al. | 438/393 |
| 6,245,655 B1 | 6/2001 | Moslehi | |
| 6,293,457 B1 * | 9/2001 | Srivastava et al. | 228/254 |
| 2002/0006468 A1 | 1/2002 | Paranjpe et al. | |
| 2002/0130161 A1 * | 9/2002 | Schmitt | 228/124.1 |
| 2003/0136265 A1 | 7/2003 | Holst et al. | |
| 2003/0183121 A1 | 10/2003 | Nasu et al. | |
| 2006/0131363 A1 * | 6/2006 | Nguyen | 228/101 |
| 2006/0158865 A1 | 7/2006 | Ohmi et al. | |
| 2006/0162849 A1 | 7/2006 | Han | |
| 2008/0081424 A1 | 4/2008 | Willer et al. | |
| 2009/0068452 A1 | 3/2009 | Sato | |
| 2009/0078570 A1 * | 3/2009 | Yi et al. | 204/298.13 |
| 2009/0081432 A1 | 3/2009 | Gomi | |
| 2009/0115823 A1 * | 5/2009 | Matsuo et al. | 347/71 |

FOREIGN PATENT DOCUMENTS

| | | | |
|---|---|---|---|
| JP | 62-124083 | | 6/1987 |
| JP | 63-183772 A | * | 7/1988 |
| JP | 3-60414 A | * | 2/1991 |
| JP | 05-082404 | | 4/1993 |
| JP | 07-164165 | | 6/1995 |
| JP | 2002-105639 A | * | 4/2002 |
| JP | 2003-147524 | | 5/2003 |
| JP | 2006-527162 | | 11/2006 |
| KR | 10-0353510 | | 9/2002 |

* cited by examiner

METHOD OF FORMING BONDED BODY AND BONDED BODY

CROSS-REFERENCE TO RELATED APPLICATION

This application claims a priority to Japanese Patent Application No. 2008-013202 filed on Jan. 23, 2008 which is hereby expressly incorporated by reference herein in its entirety.

BACKGROUND

1. Technical Field

The present invention relates to a method of forming a bonded body and a bonded body, and more particularly, a method of forming a bonded body and the bonded body formed by the method.

2. Related Art

Conventionally, when two members (base members) are bonded together to obtain a bonded body, an adhesive such as an epoxy-based adhesive, an urethane-based adhesive, or a silicone-based adhesive has been often used.

In general, an adhesive exhibits reliably high adhesiveness regardless of constituent materials of the members to be bonded. Therefore, members constituted of various materials can be bonded together in various combinations.

For example, in a case where such a bonded body is used in a droplet ejection head (an ink-jet type recording head) included in an ink-jet printer, the droplet ejection head is assembled by bonding, using an adhesive, several members constituted of different kinds of materials such as a resin-based material, a metal-based material, and a silicon-based material.

When the members are to be bonded together using the adhesive to obtain an assembled body composed from the members, a liquid or paste adhesive is applied to surfaces of the members, and then the members are attached to each other via the adhesive applied on the surfaces thereof and firmly fixed together by hardening (setting) the adhesive with an action of heat or light.

However, in the case where the members are bonded together using the adhesive, there are problems in that bonding strength between the members is low, dimensional accuracy of the obtained assembled body is low, and it takes a relatively long time until the adhesive is hardened.

Further, it is often necessary to treat the surfaces of the members to be bonded using a primer in order to improve the bonding strength between the members. Therefore, additional cost and labor hour are required for performing the primer treatment, which causes an increase in cost and complexity of the process for bonding the members.

On the other hand, as a method of forming a bonded body without using the adhesive, there is known a solid bonding method. The solid bonding method is a method of directly bonding members without an intervention of an intermediate layer constituted of an adhesive or the like (see, for example, JP-A-5-82404).

Since such a solid bonding method does not need to use the intermediate layer constituted of the adhesive or the like for bonding the members, it is possible to obtain a bonded body having high dimensional accuracy.

However, in the case where the members are bonded together using the solid bonding method, there are problems in that constituent materials of the members to be bonded are limited to specific kinds, a heat treatment must be carried out at a high temperature (e.g., about 700 to 800° C.) in a bonding process, and an atmosphere in the bonding process is limited to a reduced atmosphere.

In view of such problems, there is a demand for a method which is capable of firmly bonding members with high dimensional accuracy and efficiently bonding them at a low temperature regardless of constituent materials of the members to be bonded.

Further, when the bonded body obtained by using the method of forming such a bonded body has been used, it is preferred that the used bonded bodies are recycled from a view point of an environment. However, in order to improve a recycle rate of the used bonded bodies, members need to be bonded together by using a method of forming a bonded body in which the members can be efficiently separated (peeled off) from each other.

SUMMARY

Accordingly, it is an object of the present invention to provide a method of forming a bonded body in which two base members can be firmly and efficiently bonded together with high dimensional accuracy at a low temperature, and the two base members can be efficiently separated to each other after the use of the bonded body.

Further, it is another object of the present invention to provide a bonded body in which two base members are firmly bonded together with high dimensional accuracy and therefore it is possible to provide high reliability.

These objects are achieved by the present invention described below.

In a first aspect of the present invention, there is provided a method of forming a bonded body which is comprised of a first base member, a second base member, and a first bonding film and a second bonding film provided between the first base member and the second base member. The first bonding film and the second bonding film are constituted of copper and an organic component, and an amount of copper contained in each of the first bonding film and the second bonding film is 90 atom % or higher but lower than 99 atom % at an atomic ratio.

The method comprises: forming the first bonding film on the first base member by using a chemical vapor-film formation method; forming the second bonding film on the second base member by using a chemical vapor-film formation method; bringing the first bonding film formed on the first base member into contact with the second bonding film formed on the second base member so that the first bonding film faces the second bonding film; and applying a compressive force to the first base member and the second base member so that the first bonding film and the second bonding film are bonded together to thereby obtain the bonded body.

According to the method described above, the first bonding film and the second bonding film can be firmly and efficiently bonded together with high dimensional accuracy at a low temperature. Further, it is possible to form a bonded body in which the first base member and the second base member are capable of being separated to each other efficiently after the obtained bonded body has been used. That is, it is possible to form a bonded body in which the first bonding film and the second bonding film are capable of being peeled off to each other.

In the above method, it is preferred that in the forming processes of the first bonding film and the second bonding film, each of the first bonding film and the second bonding film is formed so that its surface roughness Ra (according to JIS B 0601) is in the range of 1 to 30 nm.

According to the method described above, it is possible to improve a contact area in which the surface of the first bonding film formed on the first base member is in contact with the surface of the second bonding film formed on the second base member.

In the above method, it is also preferred that in the applying process of the compressive force, the compressive force to be applied to the first base member and the second base member is in the range of 1 to 100 MPa.

According to the method described above, the first bonding film and the second bonding film can be reliably bonded together due to such an appropriate compressive force.

In the above method, it is also preferred that in the applying process of the compressive force, a time of applying the compressive force to the first base member and the second base member is in the range of 5 to 180 minutes.

According to the method described above, the first bonding film and the second bonding film can be reliably bonded together due to such an appropriate time.

In the above method, it is also preferred that in the applying process of the compressive force, the first bonding film and the second bonding film are heated.

According to the method described above, heating energy is applied to the first bonding film and the second bonding film, and then the compressive force is applied to the first bonding film and the second bonding film, so that they can be smoothly bonded together.

In the above method, it is also preferred that a temperature of heating the first bonding film and the second bonding film is in the range of 90 to 200° C.

According to the method described above, it is possible to reliably prevent the first base member and the second base member from being altered or deteriorated by the heat, thereby enabling to reliably bond the first bonding film and the second bonding film together.

In the above method, it is also preferred that in the applying process of the compressive force, when the compressive force to be applied to the first base member and the second base member is 50 [MPa], a time of applying the compressive force to the first base member and the second base member is defined as "Y" [minutes], a temperature of heating the first bonding film and the second bonding film is defined as "T" [K], the amount of copper contained in each of the first bonding film and the second bonding film is defined as "X" [atom %], and a gas constant is defined as "R" [J/(mol·K)], the following relation is satisfied:

$$1/Y \geq 1.43 \times 10^9 \exp[-6.60 \times 10^{-2}(100-X) - 82 \times 10^3/RT].$$

According to the method described above, it is possible to reliably obtain a bonded body in which the first base member is bonded to the second base member through the first bonding film and the second bonding film.

In the above method, it is also preferred that the applying process of the compressive force is carried out in an air atmosphere.

According to the method described above, additional cost and labor hour are not required for controlling the atmosphere in the applying processes of the compressive force, which makes it possible to apply the compressive force to the first base member and the second base member with ease.

In the above method, it is also preferred that the forming processes of the first bonding film and the second bonding film are carried out by using a metal organic chemical vapor deposition method in which an organic metal material constituted of copper and the organic component is used as a raw material.

According to the method described above, it is possible to reliably form the first bonding film and the second bonding film on the first base member and second base member, respectively, with a relatively simple operation in which conditions in the forming processes of the first bonding film and the second bonding film are appropriately set.

Such first bonding film and second bonding film are constituted of copper and the organic component, wherein in each of the first bonding film and the second bonding film, an amount of copper contained therein is 90 atom % or higher but lower than 99 atom % at the atomic ratio.

In the above method, it is also preferred that the organic metal material includes an organic copper complex.

According to the method described above, by appropriately setting the conditions in the forming processes of the first bonding film and the second bonding film, a part of the organic component contained in the organic metal material can relatively easily remain in the first bonding film and the second bonding film at a predetermined amount as the organic component which is contained in the first bonding film and the second bonding film.

In the above method, it is also preferred that a part of the organic component constituting the organic metal material remains in the first bonding film and the second bonding film.

When the part of the organic component contained in the organic metal material remains in the first bonding film and the second bonding film as the organic component which constitutes the first bonding film and the second bonding film, active hands can be reliably generated to the copper atoms which constitute the first bonding film and the second bonding film. As a result, it is supposed that the first bonding film and the second bonding film are bonded together reliably.

In the above method, it is also preferred that an average thickness of each of the first bonding film and the second bonding film is in the range of 1 to 1,000 nm.

This makes it possible to prevent dimensional accuracy of the bonded body obtained by bonding the first bonding film and the second bonding film together from being significantly lowered, thereby enabling to more firmly bond them together.

In the above method, it is also preferred that each of the first base member and the second base member has a plate shape.

According to the method described above, the first base member and the second base member can easily bend. Therefore, the first (second) base member becomes sufficiently bendable with a shape of the second (first) base member even if the second (first) base member is deformed by stress or the like.

This makes it possible to improve bonding strength between the first base member and the second base member. Further, since the first base member and the second base member can easily bend, stress which would be generated in a bonding interface therebetween can be reduced to some extent.

In the above method, it is also preferred that the first base member and the second base member have a region on which the first bonding film and the second bonding film are formed, respectively, and at least the region of each of the first base member and the second base member is constituted of a silicon material, a metal material or a glass material as a main component thereof.

This makes it possible to improve bonding strength of the first bonding film and the second bonding film against the first base member and the second base member, even if surfaces of the first base member and the second base member are not subjected to a surface treatment.

In the above method, it is also preferred that the first base member and the second base member have a surface on which the first bonding film and the second bonding film are formed, respectively, and the surface of each of the first base member and the second base member is preliminarily subjected to a surface treatment to improve bonding strength between the first base member and the first bonding film and bonding strength between the second base member and the second bonding film.

According to the method described above, the surface of each of the first base member and the second base member can be cleaned and activated, and the bonding strength between the first bonding film and the first base member and the bonding strength between the second bonding film and the second base member become higher.

In the above method, it is also preferred that the surface treatment is a plasma treatment.

According to the method described above, it is possible to optimize the surface of each of the first base member and the second base member on which the first bonding film and the second bonding film are to be formed, respectively.

In the above method, it is also preferred that the bonded body is further comprised of intermediate layers, and the intermediate layers are formed between the first base member and the first bonding film and between the second base member and the second bonding film, respectively.

According to the method described above, it is possible to obtain a bonded body having high reliability.

In the above method, it is also preferred that the intermediate layers are constituted of an oxide-based material as a main component thereof.

According to the method described above, it is possible to improve the bonding strength between the first bonding film and the first base member and the bonding strength between the second bonding film and the second base member.

In a second aspect of the present invention, there is provided a bonded body formed by the method as described above.

According to the bonded body described above, the first bonding film and the second bonding film are firmly bonded together with high dimensional accuracy. Therefore, the bonded body can have high reliability.

DESCRIPTION OF EXEMPLARY EMBODIMENTS

Figure 1A:
FIGS. 1A to 1C are longitudinal sectional views for explaining a method of forming a bonded body according to the present invention.

Hereinafter, a method of forming a bonded body, and a bonded body according to the present invention will be described in detail with reference to preferred embodiments shown in the accompanying drawings.

First, a description will be made on the method of forming the bonded body according to the present invention.

Method of Forming Bonded Body

The method of forming the bonded body according to the present invention comprises the steps of: forming a first bonding film on a first base member (member) by using a chemical vapor-film formation method; forming a second bonding film on a second base member (member) by using a chemical vapor-film formation method; bringing the first bonding film formed on the first base member into contact with the second bonding film formed on the second base member so that the first bonding film faces the second bonding film; and applying a compressive force to the first base member and the second base member so that the first bonding film and the second bonding film are bonded together to thereby obtain the bonded body.

Both the first bonding film and the second bonding film are constituted of copper and an organic component. An amount of copper contained in each of the first bonding film and the second bonding film is 90 atom % or higher but lower than 99 atom % at an atomic ratio.

These steps make it possible to bond the first bonding film and the second bonding film together which are formed on the first base member and the second base member, respectively. As a result, it is possible to obtain a bonded body in which the first base member is bonded to the second base member through the first bonding film and the second bonding film.

In such a method of forming the boded body according to the present invention, the first base member and the second base member can be effectively and firmly bonded together with high dimensional accuracy through the first bonding film and the second bonding film.

Further, by forming the bonded body by using the method of forming the bonded body, it is possible to obtain a bonded body having high dimensional accuracy in which two members, namely, the first base member and the second base member are firmly bonded together with high dimensional accuracy through the first bonding film and the second bonding film.

Furthermore, after the bonded body formed by using the method of forming the bonded body according to the present invention has been used, the first base member and the second base member can be easily separated to each other by using a method as described later. Therefore, each of the first base member and the second base member is separated from the bonded body and they can be recycled.

In other words, the first bonding film and the second bonding film are peeled off from each other. As a result, it is possible to improve a recycle rate of each of the first base member and the second base member included in the bonded body.

Hereinafter, a description will be made on each step in the method of forming the bonded body according to the present invention, and the bonded body formed by using the method of forming the bonded body.

Figure 1B:
Figure 1B:
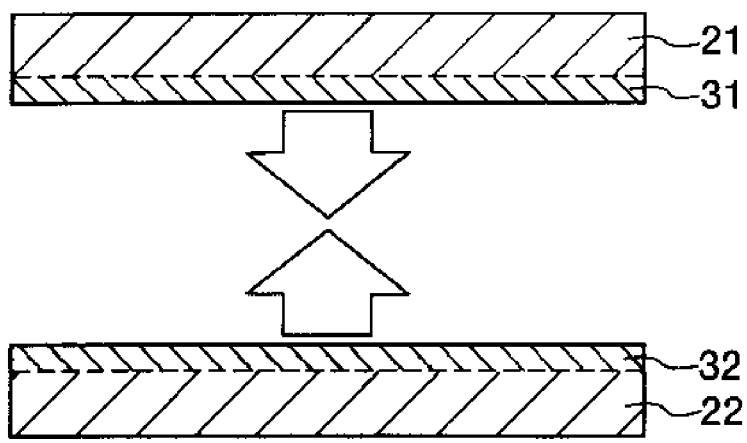
Figure 1C:
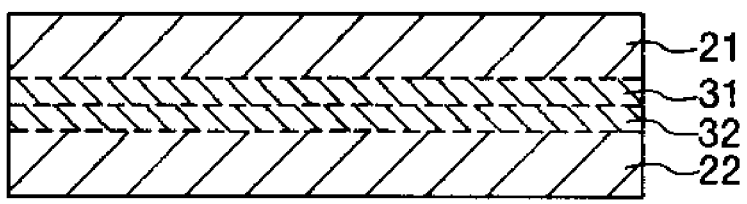
Figure 2D:
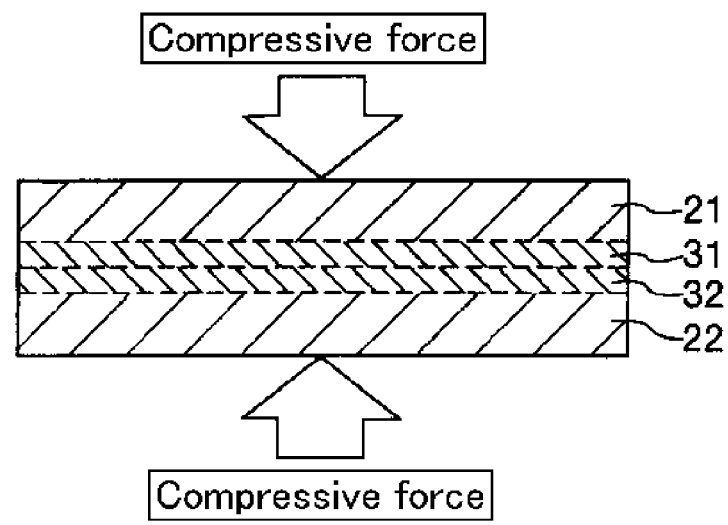
FIGS. 2D and 2E are longitudinal sectional views for explaining the method of forming the bonded body according to the present invention.
Figure 2E:
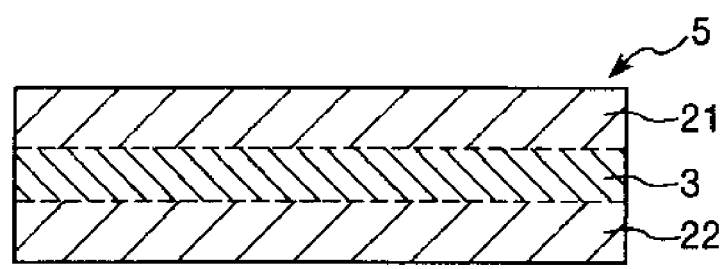
Figure 3:
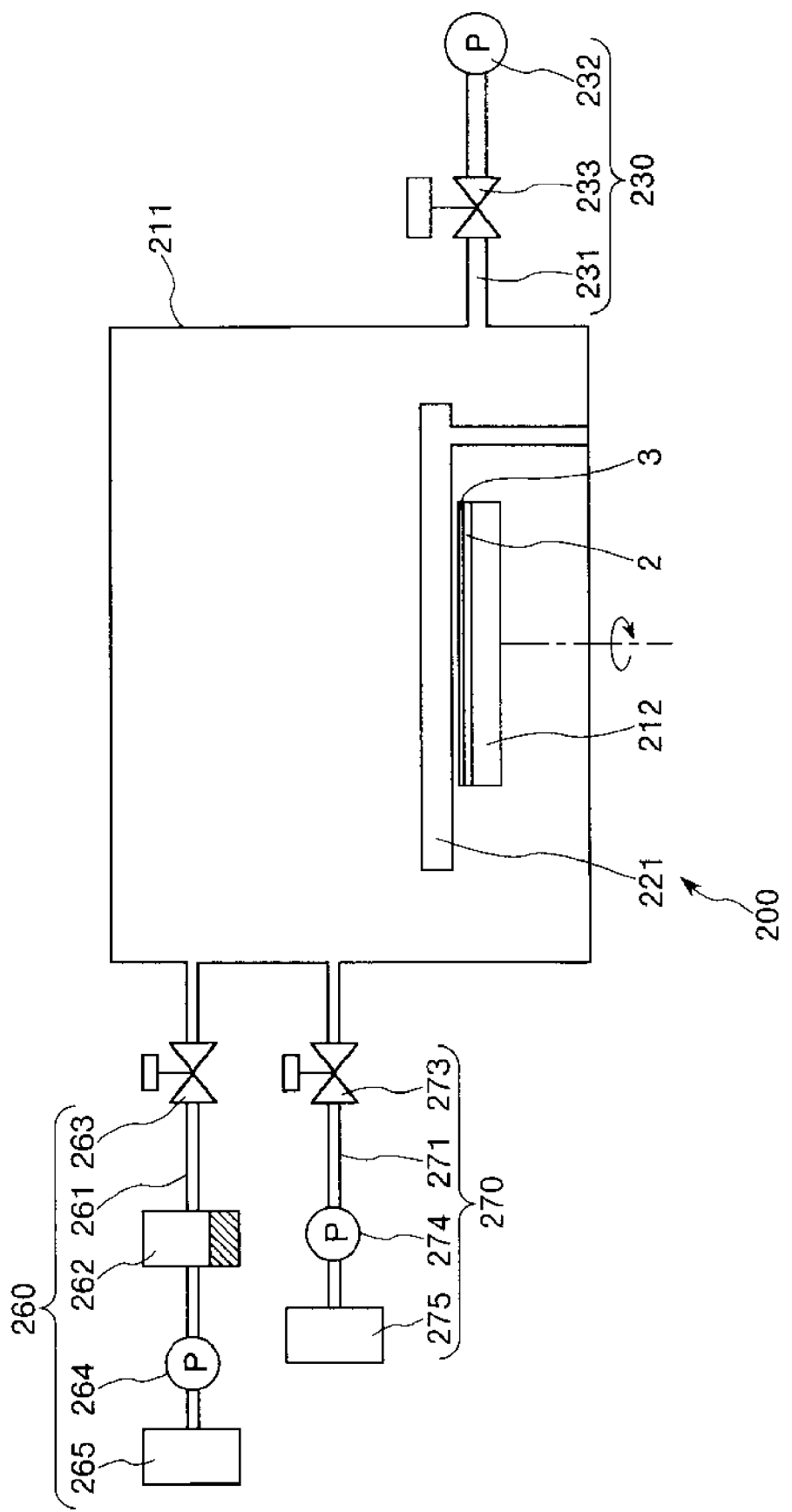
FIG. 3 is a longitudinal sectional view schematically showing a film forming apparatus used for forming a first bonding film and a second bonding film which are constituted of copper and an organic component.

FIGS. 1A to 1C are longitudinal sectional views for explaining a method of forming a bonded body according to the present invention. FIGS. 2D and 2E are longitudinal sectional views for explaining the method of forming the bonded body according to the present invention. FIG. 3 is a longitudinal sectional view schematically showing a film forming apparatus used for forming a first bonding film and a second bonding film which are constituted of copper and an organic component.

Figure 4:
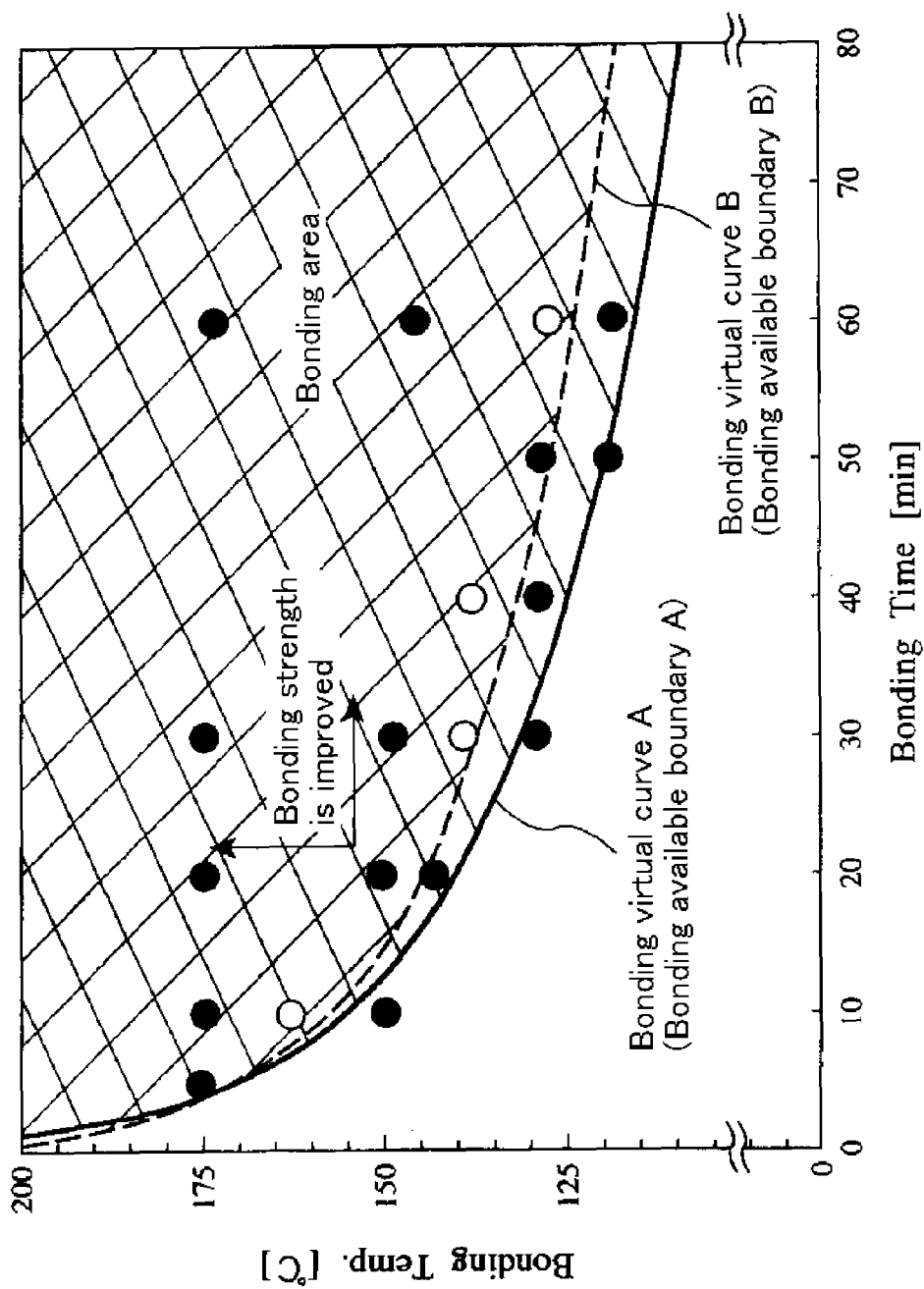
FIG. 4 is a graph showing a relationship between a bonding temperature and a bonding time when a first bonding film and a second bonding film are bonded together.

FIG. 4 is a graph showing a relationship between a bonding temperature and a bonding time when a first bonding film and a second bonding film are bonded together. In this regard, it is to be noted that in the following description, an upper side in each of FIGS. 1A to 1C, 2D and 2E, and 3 will be referred to as "upper" and a lower side thereof will be referred to as "lower".

[1] First, a first base member (hereinafter, referred to as "first substrate") 21 and a second base member (hereinafter, referred to as "second substrate") 22 are prepared. Next, a first bonding film 31 is formed on the first substrate 21 by using a chemical vapor-film formation method (FIG. 1A). Then, a second bonding film 32 is also formed on the second substrate 22 by using the chemical vapor-film formation method (FIG. 1A).

Both the first bonding film 31 and the second bonding film 32 are constituted of copper and an organic component. An amount of copper contained in each of the first bonding film 31 and the second bonding film 32 is 90 atom % or higher but lower than 99 atom % at an atomic ratio.

In this regard, it is to be noted that in the following description, "the first substrate 21 and the second substrate 22" is collectively referred to as "substrate 2", and a bonding film in which "the first bonding film 31 and the second bonding film 32" have been bonded (integrated) together is referred to as "bonding film 3" on occasions.

The first substrate 21 and the second substrate 22 are used for obtaining a bonded body 5 by bonding the first substrate 21 and the second substrate 22 together through the first bonding film 31 and the second bonding film 32. The first substrate 21 and the second substrate 22 may be constituted of any material as long as it has stiffness that can support the first bonding film 31 and the second bonding film 32 thereon before they are bonded together.

Especially, examples of a constituent material of the substrate 2 (first substrate 21 and the second substrate 22) include: a resin-based material such as polyolefin (e.g., polyethylene, polypropylene, ethylene-propylene copolymer, ethylene-vinyl acetate copolymer (EVA)), cyclic polyolefin, denatured polyolefin, polyvinyl chloride, polyvinylidene chloride, polystyrene, polyamide, polyimide, polyamide-imide, polycarbonate, poly-(4-methylpentene-1), ionomer, acrylic resin, polymethyl methacrylate, acrylonitrile-butadiene-styrene copolymer (ABS resin), acrylonitrile-styrene copolymer (AS resin), butadiene-styrene copolymer, polyoxymethylene, polyvinyl alcohol (PVA), ethylene-vinyl alcohol copolymer (EVOH), polyester (e.g., polyethylene terephthalate (PET), polyethylene naphthalate, polybutylene terephthalate (PBT) polycyclohexane terephthalate (PCT)), polyether, polyether ketone (PEK), polyether ether ketone (PEEK), polyether imide, polyacetal (POM), polyphenylene oxide, denatured polyphenylene oxide, polysulfone, polyether sulfone, polyphenylene sulfide, polyarylate, liquid crystal polymer (e.g., aromatic polyester), fluoro resin (e.g., polytetrafluoroethylene, polyfluorovinylidene), thermoplastic elastomer (e.g., styrene-based elastomer, polyolefin-based elastomer, polyvinylchloride-based elastomer, polyurethane-based elastomer, polyester-based elastomer, polyamide-based elastomer, polybutadiene-based elastomer, trans-polyisoprene-based elastomer, fluororubber-based elastomer, chlorinated polyethylene-based elastomer), epoxy resin, phenolic resin, urea resin, melamine resin, aramid resin, unsaturated polyester, silicone resin, polyurethane, or a copolymer, a blended body and a polymer alloy each having at least one of these materials as a major component thereof; a metal-based material such as a metal (e.g., Fe, Ni, Co, Cr, Mn, Zn, Pt, Au, Ag, Cu, Pd, Al, W, Ti, V, Mo, Nb, Zr, Pr, Nd, Sm), an alloy containing at least one of these metals, carbon steel, stainless steel, indium tin oxide (ITO) or gallium arsenide; a semiconductor-based material such as Si, Ge, InP or GaPN; a silicon-based material such as monocrystalline silicon, polycrystalline silicon or amorphous silicon; a glass-based material such as silicic acid glass (quartz glass), silicic acid alkali glass, soda lime glass, potash lime glass, lead (alkaline) glass, barium glass or borosilicate glass; a ceramic-based material such as alumina, zirconia, ferrite, silicon nitride, aluminum nitride, boron nitride, titanium nitride, carbon silicon, boron carbide, titanium carbide or tungsten carbide; a carbon-based material such as graphite; a complex material containing any one kind of the above materials or two or more kinds of the above materials; and the like.

Further, a surface of each of the first substrate 21 and the second substrate 22 may be subjected to a plating treatment such as a Ni plating treatment, a passivation treatment such as a chromate treatment, a nitriding treatment, or the like.

Furthermore, a shape of each of the first substrate 21 and the second substrate 22 is not particularly limited to a plate shape like this embodiment as long as it has a shape with a surface which can support the first bonding film 31 and the second bonding film 32 thereon. In other words, examples of the shape of each of the first substrate 21 and the second substrate 22 include a massive shape (a blocky shape), a stick shape, and the like.

As shown in FIG. 1A, since the shape of each the first substrate 21 and the second substrate 22 is a plate shape, the first substrate 21 and the second substrate 22 can be simply bent. Therefore, even if the first (second) substrate 21 (22) is deformed by stress or the like, the second (first) substrate 22 (21) becomes sufficiently bendable with the deformed shape of the first (second) substrate 21 (22). For this reason, high bonding strength is obtained between the first substrate 21 and the second substrate 22.

Further, since high bonding strength is obtained between the first substrate 21 and the first bonding film 31 and between the second substrate 22 and the second bonding film 32, and the first substrate 21 and the second substrate 22 can easily bend, stress which would be generated in each bonding interface therebetween can be reduced to some extent.

In this case, an average thickness of each of the first substrate 21 and the second substrate 22 is not particularly limited to a specific value, but is preferably in the range of about 0.01 to 10 mm and more preferably in the range of about 0.1 to 3 mm.

In the present invention, the first bonding film 31 and the second bonding film 32 are placed between the first substrate 21 and the second substrate 22 in a next step [2]. By bonding the first bonding film 31 and the second bonding film 32 together, the first bonding film 31 and the second bonding film 32 play a role of bonding the first substrate 21 and the second substrate 22 together.

Such first bonding film 31 and second bonding film 32 are formed on the first substrate 21 and the second substrate 22, respectively, by using the chemical vapor-film formation method. Both the first bonding film 31 and the second bonding film 32 are constituted of copper and the organic component. The amount of copper contained in each of the first bonding film 31 and second bonding film 32 is 90 atom % or higher but lower than 99 atom % at the atomic ratio.

When a compressive force is applied to both the first substrate 21 and the second substrate 22 in a state that the first bonding film 31 is brought into contact with the second bonding film 32, the first bonding film 31 and the second bonding film 32 are bonded (integrated) together. Therefore, the first substrate 21 and the second substrate 22 are firmly and efficiently bonded together with high dimensional accuracy through the first bonding film 31 and the second bonding film 32 (bonding film 3).

Further, each of the first bonding film 31 and the second bonding film 32 in which the amount of copper contained therein is 90 atom % or higher is in the form of a solid having no fluidity. Therefore, a thickness and a shape of each bonding layer (the first bonding film 31 and the second bonding film 32) are hardly changed as compared to a conventional adhesive layer formed of an aquiform or muciform (semisolid) adhesive having fluidity.

Therefore, dimensional accuracy of the bonded body 5 obtained by bonding the first substrate 21 and the second substrate 22 together through the first bonding film 31 and the second bonding film 32 becomes extremely high as compared to the conventional bonded body obtained using the adhesive layer (the adhesive).

In addition, since it is not necessary to wait until the adhesive is hardened, it is possible to firmly bond the first substrate 21 and the second substrate 22 through the first bonding film 31 and the second bonding film 32 in a short period of time as compared to the conventional bonded body.

Furthermore, in the present invention, the amount of copper contained in each of the first bonding film 31 and the second bonding film 32 which are constituted of the copper and the organic component is 90 atom % or higher but lower than 99 atom % at the atomic ratio. In other words, an amount of the organic component contained in each of the first bonding film 31 and the second bonding film 32 is 1 atom % or higher but lower than 10 atom % at the atomic ratio.

In the first bonding film 31 and the second bonding film 32, inclusion of the organic component and copper of which amounts fall within the above noted range makes it possible to achieve bonding of the first bonding film 31 and the second bonding film 32 at a low temperature as described later. In addition, it is possible to reliably and firmly bond the first substrate 21 and the second substrate 22 together with high dimensional accuracy through the first bonding film 31 and the second bonding film 32.

Further, since the amount of copper falls within the above noted range, it is possible to maintain characteristics such as superior conductive property and heat conductive property, which are derived from copper. Therefore, in the obtained bonded body 5, the first bonding film 31 and the second bonding film 32 can be reliably used for bonding wirings or terminals which are provided in a wiring substrate together and for bonding members in which heat conductive property is required together.

Specifically, a resistivity of each of the first bonding film 31 and the second bonding film 32 is preferably $1 \times 10^{-3}$ Ω·cm or lower and more preferably $1 \times 10^{-6}$ Ω·cm or lower. Further, a thermal conductivity of each of the first bonding film 31 and the second bonding film 32 is preferably 50 W·m$^{-1}$·K$^{-1}$ or higher and more preferably 200 W·m$^{-1}$·K$^{-1}$ or higher.

The first bonding film 31 and the second bonding film 32 constituted of copper and the organic component are formed on the first substrate 21 and the second substrate 22, respectively, by using a chemical vapor-film formation method (CVD method). Examples of such a chemical vapor-film formation method include, but not limited thereto, a metal organic chemical vapor deposition method (hereinafter, may be referred to as "MOCVD method"), a heat CVD method, a light CVD method, a plasma CVD method such as a RF-plasma CVD method and a ECR-plasma CVD method, a laser CVD method, and the like.

Among these methods mentioned above, the MOCVD method in which an organic metal material is used as a raw material is preferable.

According to the MOCVD method, it is possible to reliably form the first bonding film 31 and the second bonding film 32 on the first substrate 21 and the second substrate 22, respectively, with a relatively simple operation in which conditions in the forming processes of the first bonding film 31 and the second bonding film 32 are appropriately set.

Such first bonding film 31 and second bonding film 32 are constituted of copper and the organic component. In each of the first bonding film 31 and the second bonding film 32, the amount of copper contained therein is 90 atom % or higher but than lower then 99 atom % at the atomic ratio.

Hereinafter, a description will be made on one example of a case that the first bonding film 31 and the second bonding film 32 constituted of copper and the organic component are formed on the first substrate 21 and the second substrate 22, respectively, by using the MOCVD method in which the organic metal material is used as a raw material.

First, prior to the description of the method of forming the first bonding film 31 and the second bonding film 32 by using the MOCVD method, a description will be made on a film forming apparatus 200 to be used for forming the first bonding film 31 and the second bonding film 32 on the first substrate 21 and the second substrate 22, respectively.

The film forming apparatus 200 shown in FIG. 3 is configured so that the first bonding film 31 and the second bonding film 32 are formed by the metal organic chemical vapor deposition method (MOCVD method) in a chamber 211 provided therein.

Specifically, the film forming apparatus 200 includes a chamber (a vacuum chamber) 211, a substrate holder (a film formation object holding unit) 212 that is provided in the chamber 211 and holds the substrate 2 (a film formation object), an organic metal material supplying means 260 that supplies a vaporized or atomized organic metal material into the chamber 211, a gas supplying means 270 that supplies gas for setting the inside of the chamber 211 to a low reducing atmosphere, an evacuating means 230 that evacuates the gas in the chamber 211 and controls pressure therein, and a heating means (not shown) that heats the substrate holder 212.

In this embodiment, the substrate holder 212 is attached to a bottom of the chamber 211. The substrate holder 212 is pivotable by actuating a motor. This makes it possible to form a first bonding film 31 and a second bonding film 32 having homogeneity and an uniform thickness on the first substrate 21 and the second substrate, respectively.

Further, a shutter 221 that can cover the substrate holder 212 is provided near the same. The shutter 221 prevents the first substrate 21, the second substrate 22, the first bonding film 31 and the second bonding film 32 from being exposed to an unnecessary atmosphere and the like.

The organic metal material supplying means 260 is connected to the chamber 211. The organic metal material supplying means 260 includes a storage tank 262 that stores a solid organic metal material, a gas cylinder 265 that stores a carrier gas for supplying the vaporized or atomized organic metal material into the chamber 211, a gas supply line 261 that leads the carrier gas and the vaporized or atomized organic metal material into the chamber 211, and a pump 264 and a valve 263 provided in the gas supply line 261.

In the organic metal material supplying means 260 having such a configuration, the storage tank 262 has heating means, and the solid organic metal material can be heated by actuating the heating means so that it is vaporized or atomized.

Therefore, when the pump 264 is actuated to supply the carrier gas from the gas cylinder 265 to the storage tank 262 in a state that the valve 263 is opened, the vaporized or atomized organic metal material is supplied into the chamber 211 through the supply line 261 together with the carrier gas.

The carrier gas is not particularly limited to a specific kind. As the carrier gas, a nitrogen gas, an argon gas, a helium gas, and the like may be preferably used.

Further, in this embodiment, the gas supplying means 270 is connected to the chamber 211. The gas supplying means 270 includes a gas cylinder 275 that stores gas for setting the inside of the chamber 211 to a low reducing atmosphere, a gas supply line 271 that leads the gas into the gas chamber 211, and a pump 274 and a valve 273 provided in the gas supply line 271.

In the gas supplying means 270 having such a configuration, when the pump 274 is actuated in a state that the valve 273 is opened, the gas for setting the inside of the chamber 211 to the low reducing atmosphere is supplied from the gas cylinder 275 into the chamber 211 through the supply line 271. By configuring the gas supplying means 270 as described above, it is possible to reliably set the inside of the chamber 211 to the low reducing atmosphere with respect to the organic metal material.

As a result, in the case where the first bonding film 31 and the second bonding film 32 are formed from the organic metal material by using the MOCVD method, the first bonding film 31 and the second bonding film 32 are formed in a state that at least a part of an organic compound contained in the organic metal material remains therein.

The gas for setting the inside of the chamber 211 to the low reducing atmosphere is not particularly limited to a specific kind. Examples of the gas include: a nitrogen gas; a rare gas such as helium, argon and xenon; and the like. Any one kind of the above gases may be used singly, or two or more kinds of the above gases may be used in combination.

In the case where a material containing oxygen atoms in a molecule structure thereof such as 2,4-pentadionato copper (II), [cu(hfac)(VTMS)], or bis(2,6-dimethyl-2-(trimethylsilyloxy)-3,5-heptadionato) copper (II) ($Cu(sopd)_2$) described later is used as the organic metal material, a hydrogen gas is preferably added to the gas for setting the inside of the chamber 211 to the low reducing atmosphere.

This makes it possible to improve reducing property with respect to the oxygen atoms and to form the first bonding film 31 and the second bonding film 32 so that no excessive oxygen atoms remain therein. As a result, both the first bonding film 31 and the second bonding film 32 have a low abundance ratio of a metal oxide therein so that they can exhibit excellent conductive property.

Further, in the case where at least one kind of the nitrogen gas, the argon gas and the helium gas described above is used as the carrier gas, the carrier gas also can serve as the gas for setting the inside of the chamber 211 to the low reducing atmosphere.

The evacuating means 230 includes a pump 232, an evacuating line 231 that communicates the pump 232 and the chamber 211 with each other, and a valve 233 provided at a middle of the evacuating line 231. The evacuating means 230 can decompress the inside of the chamber 211 to a desired pressure.

In the film forming apparatus 200 having the configuration described above, the first bonding film 31 and the second bonding film 32 can be formed on the first substrate 21 and the second substrate 22 by using the MOCVD method as described below, respectively.

In this regard, a method of forming the first bonding film 31 on the first substrate 21 is the same as that of forming the second bonding film 32 on the second substrate 22. Therefore, in the following steps [1-1] to [1-3], a description will be made on the method of forming the first bonding film 31 on the first substrate 21 as representative. However, it goes without saying that the description can be applied to the method of forming the second bonding film 32 on the second substrate 22.

[1-1] First, the first substrate 21 is prepared. The first substrate 21 is conveyed into the chamber 211 of the film forming apparatus 200 and mounted (set) on the substrate holder 212.

It is to be noted that the first substrate 21 and the second substrate 22 may be simultaneously mounted on the substrate holder 212 and then the first bonding film 31 and the second bonding film 32 may be simultaneously formed on the first substrate 21 and the second substrate 22, respectively.

Further, it is also to be noted that the first substrate 21 and the second substrate 22 may be separately mounted on the substrate holder 212 and then the first bonding film 31 and the second bonding film 32 may be separately formed on the first substrate 21 and the second substrate 22, respectively.

[1-2] Next, the inside of the chamber 211 is decompressed by opening the valve 233 in a state that the evacuating means 230 is actuated, i.e., the pump 232 is actuated. A degree of the decompression (a degree of vacuum) is not particularly limited to a specific value, but is preferably in the range of about $1 \times 10^{-3}$ to $5 \times 10^2$ Torr and more preferably in the range of about 1 to $1 \times 10^2$ Torr when the first bonding film 31 is formed on the first substrate 21 in a next step [1-3].

Further, the gas for setting the inside of the chamber 211 to the low reducing atmosphere is supplied into the chamber 211 by opening the valve 273 in a state that the gas supplying means 270 is actuated, i.e., the pump 274 is actuated. As a result, the inside of the chamber 211 is set to the low reducing atmosphere.

In the case where a hydrogen gas is added to the gas for setting the inside of the chamber 211 to the low reducing atmosphere, it is preferred that the hydrogen gas is added to the gas so that a partial pressure of hydrogen becomes a pressure in the range of about 40 to 60% with respect to a pressure of the inside of the chamber 211.

Furthermore, at this time, the heating means is actuated to heat the substrate holder 212. A temperature of the substrate holder 212 is preferably in the range of about 80 to 300° C. and more preferably in the range of about 100 to 275° C., although being slightly different depending on kind of the first bonding film 31 (pure copper film), that is, kind of a raw material to be used for forming the first bonding film 31.

By setting the temperature to the above range, it is possible to form the first bonding film 31 constituted of copper and the organic component by using the organic metal material described later. In this regard, the amount of copper contained in the first bonding film 31 is 90 atom % or higher but lower than 99 atom % at the atomic ratio.

[1-3] Next, the shutter 221 is opened. The solid organic metal material stored in the storage tank 262 is heated by actuating the heating means provided in the storage tank 262 to thereby vaporize or atomize it. In this state, the vaporized or atomized organic metal material is supplied into the chamber 211 together with the carrier gas by actuating the pump 264 and opening the valve 263.

In this way, when the vaporized or atomized organic metal material is supplied into the chamber 211 in a state that the substrate holder 212 is heated in the step [1-2], the vaporized or atomized organic metal material is heated on the first substrate 21.

This makes it possible to form the first bonding film 31 constituted copper and the organic component on the first substrate 21 by reducing the metal contained in the organic metal material in a state that a part of an organic compound (organic component) contained in the organic metal material remains therein. In this regard, the amount of copper contained in the first bonding film 31 is 90 atom % or higher but lower than 99 atom % at the atomic ratio.

The organic metal material to be used for forming the first bonding film 31 constituted of copper and the organic component by using such a MOCVD method is not particularly limited to a specific kind.

Examples of the organic metal material include: an organic copper complex such as 2,4-pentadionato copper(II), bis(2,6-dimethyl-2-(trimethylsilyloxy)-3,5-heptadionato) copper (II) (Cu(sopd)$_2$; C$_{24}$H$_{46}$CuO$_6$Si$_2$), Cu (hexafluoroacetylacetonato) (vinyltrimethylsilane) (Cu(hfac) (VTMS)), Cu(hexafluoroacetylacetonato) (2-methyl-1-hexene-3-en) (Cu(hfac) (MHY)), Cu (perfluoroacetylacetonato) (vinyltrimethylsilane) (Cu(pfac) (VTMS)), and Cu(perfluoroacetylacetonato) (2-methyl-1-hexene-3-en) (Cu(pfac)(MHY)); and the like.

When these organic copper complexes mentioned above are used as the organic metal material, the part of the organic compound (organic component) contained in the organic metal material can be allowed to relatively easily remain in the first bonding film 31 at a predetermined amount by appropriately setting conditions in forming the first bonding film 31. In other words, the amount of copper contained in the first bonding film 31 can be relatively easily set to 90 atom % or higher but lower than 99 atom % at the atomic ratio.

As described above, when the first bonding film 31 constituted of copper and the organic component is formed on the first substrate 21 by using such an organic metal material, the part of the organic compound contained in the organic metal material remains in the first bonding film 31 as the organic component.

It is supposed that the remaining part of such an organic compound makes it possible to reliably obtain active hands to copper atoms contained in the first bonding film 31 according to a mechanism of bonding the first bonding film 31 and the second bonding film 32 together described later. As a result, the first bonding film 31 and the second bonding film 32 can be reliably bonded together under the conditions in a step [2] which will be described later.

An amount of the vaporized or atomized organic metal material to be supplied into the chamber 211 is preferably in the range of about 0.1 to 10 g/minutes and more preferably in the range of about 0.5 to 2 g/minutes. This makes it possible to reliably form the first bonding film 31 on the first substrate 21 in a state that a thickness of the first bonding film 31 is uniform and the part of the organic compound contained in the organic metal material remains therein.

In this way, it is possible to form the first bonding film 31 constituted of copper and the organic component on the first substrate 21 so that the amount of copper contained in the first bonding film 31 is 90 atom % or higher but lower than 99 atom % at the atomic ratio.

Further, an average thickness of the first bonding film 31 to be formed on the first substrate 21 is preferably in the range of about 1 to 500 nm and more preferably in the range of about 20 to 400 nm. By setting the average thickness of the first bonding film 31 to the above range, it is possible to prevent dimensional accuracy of the bonded body 5 obtained by bonding the first substrate 21 and the second substrate 22 together through the first bonding film 31 and the second bonding film 32 from being significantly lowered, thereby enabling to more firmly bond them together.

In other words, if the average thickness of the first bonding film 31 is thinner than the above lower limit value, there is a case that the bonded body 5 having sufficient bonding strength cannot be obtained. On the other hand, if the average thickness of the first bonding film 31 exceeds the above upper limit value, there is a fear that dimensional accuracy of the bonded body 5 is lowered significantly.

In addition, in the case where the average thickness of the first bonding film 31 is set to the above range, a certain degree of shape following property is ensured to the first bonding film 31. For this reason, even if irregularities are generated on a bonding surface (a surface to be adjoined to the first bonding film 31) of the first substrate 21, the first bonding film 31 can be formed on the first substrate 21 so as to follow the shape of the irregularities of the bonding surface of the first substrate 21 though depending on sizes (heights) thereof.

As a result, it is possible to suppress sizes of irregularities of the surface of the first bonding film 31 from being extremely enlarged. Namely, it is possible to improve flatness of the surface of the first bonding film 31. This makes it possible to improve bonding strength between the first bonding film 31 and the second bonding film 32 when the first bonding film 31 formed on the first substrate 21 is brought into contact with the second bonding film 32 formed on the second substrate 22 so as to face them to each other.

The thicker the thickness of the first bonding film 31 is, the higher degrees of the above shape following property of the first bonding film 31 become. Therefore, it is preferred that the thickness of the first bonding film 31 is as thick as possible in order to further improve the degrees of the shape following property of the first bonding film 31.

A surface roughness Ra of the first bonding film 31 (according to JIS B 0601) is not particularly limited to a specific value, but is preferably in the range of about 1 to 30 nm and more preferably in the range of about 5 to 15 nm.

This makes it possible to increase a contact area in which the first bonding film 31 is brought into contact with the second bonding film 32 when the first bonding film 31 is brought into contact with the second bonding film 32 in the next step [2]. Additionally, it is possible to increase a bonding number obtained by bonding active hands existing on the surfaces of the first bonding film 31 and the second bonding film 32 together.

Prior to forming the first bonding film 31, it is preferred that at least a predetermined region of the first substrate 21 where the first bonding film 31 is to be formed has been, in advance, subjected to a surface treatment for improving bonding strength between the first substrate 21 and the first bonding film 31, though depending on the constituent material of the first substrate 21.

Examples of such a surface treatment include: a physical surface treatment such as a sputtering treatment or a blast treatment; a chemical surface treatment such as a plasma treatment performed using oxygen plasma and nitrogen plasma, a corona discharge treatment, an etching treatment, an electron beam irradiation treatment, an ultraviolet ray irradiation treatment or an ozone exposure treatment; a treatment performed by combining two or more kinds of these surface treatments; and the like.

By subjecting the predetermined region of the first substrate 21 where the first bonding film 31 is to be formed to such a treatment, it is possible to clean and activate the predetermined region. This makes it possible to improve the bonding strength between the first bonding film 31 and the first substrate 21.

Among these surface treatments, use of the plasma treatment makes it possible to particularly optimize the surface (the predetermined region) of the first substrate 21 so as to be able to form the first bonding film 31 thereon.

In this regard, it is to be noted that in the case where the first substrate 21 of which surface has been subjected to the surface treatment is formed of a resin material (a polymeric material), the corona discharge treatment, the nitrogen plasma treatment and the like are particularly preferably used.

Depending on the constituent material of the first substrate 21, the bonding strength of the first bonding film 31 against the first substrate 21 becomes sufficiently high even if the surface of the first substrate 21 is not subjected to the surface treatment described above.

Examples of the constituent material of the first substrate 21 with which such an effect can be obtained include materials containing various kinds of metal-based materials, various kinds of silicon-based materials, various kinds of glass-based materials and the like as a major component thereof.

The surface of the substrate 2 formed of such a material is covered with an oxide film. In the oxide film, hydroxyl groups having relatively high activity exist in a surface thereof. Therefore, in this case, it is possible to improve bonding strength of the first bonding film 31 against the first substrate 21 without subjecting the surface thereof to the surface treatment described above, which makes it possible to firmly bond the first bonding film 31 and the first substrate 21.

In this case, the entire of the first substrate 21 may not be constituted of the above materials, as long as at least a region of the surface of the first substrate 21 where the first bonding film 31 is to be formed is constituted of the above materials.

Further, instead of the surface treatment, an intermediate layer may have been, in advance, provided on at least a predetermined region of the first substrate 21 where the first bonding film 31 is to be formed. This intermediate layer may have any function.

Such a function is not particularly limited to a specific kind. Examples of the function include: a function of improving binding strength of the first substrate 21 to the first bonding film 31; a cushion property (that is, a buffering function); a function of reducing stress concentration; a function of accelerating film growth of the first bonding film 31 when forming it (that is, a function as a seed layer); a function of protecting the first bonding film 31 (that is, a function as a barrier layer); and the like.

By bonding the first substrate 21 and the first bonding film 31 together through the intermediate layer, a bonded body 5 having a high reliability can be obtained.

Examples of a constituent material of the intermediate layer include: a metal-based material such as aluminum, titanium, tungsten, copper or an alloy containing atoms of these metals; an oxide-based material such as metal oxide or silicon oxide; a nitride-based material such as metal nitride or silicon nitride; a carbon-based material such as graphite or diamond-like carbon; a self-organization film material such as a silane coupling agent, a thiol-based compound, metal alkoxide or metal halide; a resin-based material such as a resin-based adhesive agent, a resin filming material, various rubbers or various elastomers; and the like, and one or more of these materials which may be used independently or in combination.

Among such intermediate layers constituted of these various materials, use of the intermediate layer constituted of the oxide-based material makes it possible to further improve bonding strength between the first substrate 21 and the first bonding film 31 through the intermediate layer.

[2] Next, the first bonding film 31 is brought into contact with the second bonding film 32 (FIG. 1C) so that the first bonding film 31 formed on the first substrate 21 faces the second bonding film 32 formed on the second substrate 22 (FIG. 1B). In this state, the compressive force is applied to both the first substrate 21 and the second substrate 22 (FIG. 2D).

By doing so, the first bonding film 31 and the second bonding film 32 are bonded (integrated) together to thereby obtain a bonded body 5 according to the present invention in which the first substrate 21 is bonded to the second substrate 22 through the bonding film 3 (FIG. 2E).

In the bonded body 5 obtained in this way, the first substrate 21 and the second substrate 22 are bonded together by firm chemical bonds formed in a short period of time, unlike bond (adhesion) mainly based on a physical bond such as an anchor effect obtained by using the conventional adhesive which has been used in a conventional method. Therefore, it is possible to obtain a bonded body 5 in a short period of time, and to prevent occurrence of peeling off, bonding unevenness and the like in the bonded body 5.

In this regard, it is to be noted that the first bonding film 31 and the second bonding film 32 are not bonded together in a state that the first bonding film 31 is brought into contact with the second bonding film 32 as shown in FIG. 1C in the present invention. Therefore, it is possible to adjust a relative position of the first substrate 21 with respect to the second substrate 22.

For this reason, the relative position of the first substrate 21 can be easily and finely adjusted after the first bonding film 31 is brought into contact with the second bonding film 32. As a result, it is possible to bond the first bonding film 31 formed on the first substrate 21 and the second bonding film 32 formed on the second substrate 22 together at an accurate position.

When the bonded body 5 is obtained by using the method of forming such a bonded body 5, the bonding film 3 in the bonded body 5 contains the organic component of which amount is 1 atom % or higher but lower than 10 atom %, which will be described in detail. This requires that a temperature to heat the first bonding film 31 and the second bonding film 32 is set at a slightly high temperature as compared to a bonding film containing an organic component of which amount is 1 atom %, that is the bonding film constituted of mainly copper.

However, in the method according to the present invention, the temperature to heat the first bonding film 31 and the second bonding film 32 can be set at 200° C. or less. That is to say, the method according to the present invention does not require a heat treatment to be carried out at a high temperature (e.g. 700° C. or higher). Therefore, the method according to the present invention can also use a first substrate 21 and a second substrate 22 constituted of materials having low heat resistance.

Further, since the first substrate 21 and the second substrate 22 are bonded together through the first bonding film 31 and the second bonding film 32, the method according to the present invention has an advantage in that constituent materials of the first substrate 21 and the second substrate 22 are not particularly limited to a specific material. Therefore, it is possible to select the constituent materials of the first substrate 21 and the second substrate 22 from various materials.

Furthermore, in the conventional solid bonding method, a first substrate and a second substrate have been bonded together without a bonding film. Therefore, in the case where there is a large difference in thermal expansion coefficients of the first substrate and the second substrate exhibit, stress based on the difference tends to concentrate on a bonding interface therebetween. As a result, there is a fear that peeling at the bonding interface is likely to occur.

However, since the bonded body 5 according to the present invention has the bonding film 3, the concentration of the stress which would be generated is reduced due to the presence thereof. This makes it possible to reliably suppress or prevent occurrence of peeling off of the bonding film 3 in the bonded body 5.

Although the constituent material of the first substrate 21 may be different from or the same as that of the second substrate 22, it is preferred that the first substrate 21 and the second substrate 22 have substantially equal thermal expansion coefficients with each other.

In the case where the first substrate 21 and the second substrate 22 have the substantially equal thermal expansion coefficients with each other, when the first substrate 21 and the second substrate 22 are bonded together through the first bonding film 31 and the second bonding film 32, stress due to thermal expansion is less easily generated on a bonding interface therebetween. As a result, it is possible to reliably prevent occurrence of deficiencies such as peeling off of the bonding film 3 in the bonded body 5 finally obtained.

Further, in the case where the first substrate 21 and the second substrate 22 have a difference in their thermal expansion coefficients with each other, it is preferred that conditions for applying the compressive force to the first substrate 21 and the second substrate 22 are optimized as follows.

This makes it possible to firmly bond the first substrate 21 and the second substrate 22 together through the first bonding film 31 and the second bonding film 32 with high dimensional accuracy.

In other words, in the case where the first substrate 21 and the second substrate 22 have the difference in their thermal expansion coefficients with each other, it is preferred that the compressive force is applied to the first substrate 21 and the second substrate 22 at a temperature as low as possible.

If the compressive force is applied to the first substrate 21 and the second substrate 22 at the low temperature, it is possible to further reduce thermal stress which would be generated on the first bonding film 31 and the second bonding film 32.

Specifically, the first substrate 21 and the second substrate 22 are bonded together in a state that each of the first substrate 21 and the second substrate 22 is heated preferably at a temperature of about 25 to 50° C. and more preferably at a temperature of about 25 to 40° C., though being different depending on the difference between the thermal expansion coefficients thereof.

In such a temperature range, even if the difference between the thermal expansion coefficients of the first substrate 21 and the second substrate 22 is large, it is possible to sufficiently reduce thermal stress which would be generated on the bonding interface between the first bonding film 31 and the first substrate 21 and the bonding interface between the second bonding film 32 and the second substrate 22.

As a result, it is possible to reliably suppress or prevent occurrence of warp, peeling off or the like of the bonding film 3 in the bonded body 5.

In this case, in the case where the difference between the thermal expansion coefficients of the first substrate 21 and the second substrate 22 is equal to or larger than $5 \times 10^{-5}$/K, it is particularly recommended that the first substrate 21 and the second substrate 22 are bonded together through the first bonding film 31 and the second bonding film 32 at a temperature as low as possible as described above.

Moreover, it is preferred that the first substrate 21 and the second substrate 22 have a difference in their rigidities. This makes it possible to more firmly bond the first substrate 21 and the second substrate 22 together through the first bonding film 31 and the second bonding film 32.

Further, it is preferred that at least one of the first substrate 21 and the second substrate 22 is constituted of a resin material. When the first substrate 21 and the second substrate 22 are bonded together through the first bonding film 31 and the second bonding film 32, it is possible to reduce stress which would be generated on the bonding interfaces between the first bonding film 31 and the first substrate 21 and between the second bonding film 32 and the second substrate 22 due to plasticity of the resin material itself.

As a result, breaking of the bonding interfaces becomes difficult to occur. This makes it possible to obtain a bonded body 5 having high bonding strength between the first substrate 21 and the second substrate 22.

In the bonded body 5 obtained in this way, bonding strength between the first substrate 21 and the second substrate 22 is preferably equal to or larger than 5 MPa (50 kgf/cm$^2$) and more preferably equal to or larger than 10 MPa (100 kgf/cm$^2$), though being different depending on the constituent material of each of the first substrate 21 and the second substrate 22.

Therefore, peeling off of the bonding film 3 in the bonded body 5 can be sufficiently prevented. As described later, in the case where a droplet ejection head is formed using the bonded body 5, it is possible to obtain a droplet ejection head having excellent durability.

Here, it is preferred that the compressive force to be applied to the first substrate 21 and the second substrate 22 is as large as possible within a degree that the obtained bonded body 5, that is, the first substrate 21, the second substrate 22 and the first bonding film 31, the second bonding film 32 do not suffer damage.

Therefore, on the assumption that conditions other than the conditions such as a temperature for heating the first bonding film 31 and the second bonding film 32 in each step of the method according to the present invention are constant, it is possible to increase bonding strength between the first substrate 21 and the second substrate 22 according to a degree of the compressive force to be applied.

In this regard, it is to be noted that the compressive force to be applied is appropriately set depending on the constituent materials and the thicknesses of the first substrate 21 and the second substrate 22, a time for applying the compressive force to the first substrate 21 and the second substrate 22, a temperature of the first bonding film 31 and the second bonding film 32, and the like.

Specifically, the compressive force to be applied is preferably in the range of about 1 to 100 MPa and more preferably in the range of about 5 to 50 MP. By setting the compressive force to the above range, it is possible to reliably bond the first bonding film 31 and the second bonding film 32 together.

In this regard, if the compressive force exceeds the upper limit value noted above, there is a possibility that the first substrate 21 and the second substrate 22 are damaged depending on the constituent materials of the first substrate 21 and the second substrate 22.

Further, the time for applying the compressive force to the first substrate 21 and the second substrate 22 is appropriately set depending on the strength of the compressive force to be applied, the temperatures of the first bonding film 31 and the second bonding film 32, and the like.

For example, if the compressive force to be applied to the first substrate 21 and the second substrate 22 is large, the first bonding film 31 and the second bonding film 32 can be bonded together even if the time for applying the compressive force thereto is set in a short time.

Therefore, the time for applying the compressive force thereto is set in a short time. Specifically, such a time is preferably in the range of about 5 to 180 minutes and more preferably in the range of about 10 to 80 minutes. By setting the time to above noted range, it is possible to reliably bond the first bonding film 31 and the second bonding film 32 together.

Furthermore, when the compressive force is applied to the first substrate 21 and the second substrate 22, it is preferred that both the first bonding film 31 and the second bonding film 32 are heated. This makes it possible to apply heat energy to the first bonding film 31 and the second bonding film 32, thereby reliably bonding the first bonding film 31 and the second bonding film 32 together by applying the compressive force to the first substrate 21 and the second substrate 22.

The temperature in heating the first bonding film 31 and the second bonding film 32 is not particularly limited to a specific value, as long as the temperature is higher than room temperature and lower than a heat resistant temperature of each of the first substrate 21 and the second substrate 22.

Specifically, the temperature is preferably in the range of about 90 to 200° C. and more preferably in the range of about 150 to 180° C. If the first bonding film 31 and the second bonding film 32 are heated at the temperature of the above range, it is possible to reliably bond the first bonding film 31 and the second bonding film 32 together while reliably preventing the first substrate 21 and the second substrate 22 from being thermally altered and deteriorated.

In addition, it is possible to reliably improve the bonding strength between the first bonding film 31 and the second bonding film 32. In other words, it is possible to accelerate a bonding process of the first bonding film 31 and the second bonding film 32 at a relatively low temperature, thereby enabling the bonding strength between the first bonding film 31 and the second bonding film 32 to be improved.

As described above, in order to reliably obtain a bonded body 5 in which the first substrate 21 is bonded to the second substrate 22 through the bonding film 3, the compressive force to be applied to the first substrate 21 and the second substrate 22, the time for applying the compressive force to the first substrate 21 and the second substrate 22, and the temperature for heating the first bonding film 31 and the second bonding film 32 need to be appropriately set.

Further, a relation among the compressive force to be applied to the first substrate 21 and the second substrate 22, the time for applying the compressive force to the first substrate 21 and the second substrate 22, and the temperature for heating the first bonding film 31 and the second bonding film 32 is changed depending on an amount of the organic component contained in each of the first bonding film 31 and the second bonding film 32.

In this regard, it is to be noted that the amount of the organic component varies the amount of copper in each of the first bonding film 31 and the second bonding film 32. Therefore, the amount of copper also needs to be appropriately set.

The inventors have focused their attention on this fact that the relation is changed and studied it. As a result, when the compressive force to be applied to the first substrate 21 and the second substrate 22 is set to 50 [MPa], the time for applying the compressive force to the first substrate 21 and the second substrate 22 is defined as "Y" [minutes], the temperature for heating the first bonding film 31 and the second bonding film 32 is defined as "T" [K], the amount of copper contained in each of the first bonding film 31 and the second bonding film 32 is defined as "X" [atom %], and gas constant is defined as "R" [J/(mol·K)], it has found that "T", "X", and "Y" may be set so as to satisfy a relation of the following formula (1).

$$1/Y \geq 1.43 \times 10^9 \exp[-6.60 \times 10^2 (100-X) - 82 \times 10^3 / RT] \tag{1}$$

By satisfying such a relation of the formula (1), the first bonding film 31 and the second bonding film 32 can be bonded together more reliably. Therefore, it is possible to reliably obtain a bonded body 5 in which the first substrate 21 and the second substrate 22 are bonded together through the bonding film 3.

By satisfying such a relation of the formula (1), the first bonding film 31 and the second bonding film 32 can be bonded together. This formula is obtained on a basis of results of study of the inventors as described below.

When the amount of copper contained in each of the first bonding film 31 and the second bonding film 32 is 99 atom %, the compressive force to be applied to the first substrate 21 and the second substrate 22 is set to 50 [MPa].

In this case, a relation between the time for applying the compressive force to the first substrate 21 and the second substrate 22 until the first bonding film 31 and the second bonding film 32 are bonded together and the temperature for heating the first bonding film 31 and the second bonding film 32 has been studied.

As a result, by setting the time for applying the compressive force to the first substrate 21 and the second substrate 22 and the temperature for heating the first bonding film 31 and the second bonding film 32 so that they are positioned on a bonding virtual curve A as shown in FIG. 4, it has found that the first bonding film 31 and the second bonding film 32 are bonded together.

In other words, when both the time for applying the compressive force to the first substrate 21 and the second substrate 22 and the temperature for heating the first bonding film 31 and the second bonding film 32 are positioned on the points "●" shown in FIG. 4, the first bonding film 31 and the second bonding film 32 can be bonded together.

Therefore, it has found that a first quadrant of an orthogonal coordinate system in FIG. 4 is divided to a bonding area and a non-bonding area by the bonding virtual curve A as a boundary.

Additionally, it has also found that when the amount of copper contained in each of the first bonding film 31 and the second bonding film 32 is 99 atom %, the bonding virtual curve A serves as a bonding available boundary A.

Further, when the amount of copper contained in each of the first bonding film 31 and the second bonding film 32 is 90 atom %, the compressive force to be applied to the first substrate 21 and the second substrate 22 is set to 50 [MPa].

In this case, the relation between the time for applying the compressive force to the first substrate 21 and the second substrate 22 until the first bonding film 31 and the second bonding film 32 are bonded together and the temperature for heating the first bonding film 31 and the second bonding film 32 has been also studied in the same manner as described above.

As a result, when both the time for applying the compressive force to the first substrate 21 and the second substrate 22 and the temperature for heating the first bonding film 31 and the second bonding film 32 are positioned on the points "○" shown in FIG. 4, the first bonding film 31 and the second bonding film 32 are bonded together.

Therefore, it has found that the first quadrant of the orthogonal coordinate system in FIG. 4 is divided to a bonding area and a non-bonding area by a bonding virtual curve B as a boundary as shown in FIG. 4. Additionally, it has also found that when the amount of copper contained in each of the first bonding film 31 and the second bonding film 32 is 90 atom %, the bonding virtual curve B serves as a bonding available boundary B.

In this way, an area in which a rising diagonal stroke from bottom left to top right is drawn in FIG. 4 is a bonding area in which the first bonding film 31 and the second bonding film 32 are bonded together. In other words, the bonding area is an upper area than the bonding available boundary A in the first quadrant of the orthogonal coordinate system shown in FIG. 4. In this case, copper having the amount of 99 atom % is contained in each of the first bonding film 31 and the second bonding film 32.

It has found that if the time for applying the compressive force to the first substrate 21 and the second substrate 22 and the temperature for heating the first bonding film 31 and the second bonding film 32 are set so as to be positioned in the bonding area (points "●"), the first bonding film 31 and the second bonding film 32 can be reliably bonded together.

On the other hand, an area in which a rising diagonal stroke from bottom right to top left is drawn in FIG. 4 is a bonding area in which the first bonding film 31 and the second bonding film 32 are bonded together. In other words, the bonding area is an upper area (that is, shaded area) than the bonding available boundary B in the first quadrant of the orthogonal coordinate system shown in FIG. 4. In this case, copper having the amount of 90 atom % is contained in each of the first bonding film 31 and the second bonding film 32.

It has found that if the time for applying the compressive force to the first substrate 21 and the second substrate 22 and the temperature for heating the first bonding film 31 and the second bonding film 32 are set so as to be positioned in the bonding area (points "●"), the first bonding film 31 and the second bonding film 32 can be reliably bonded together.

Furthermore, it has also found that in the case where the time for applying the compressive force to the first substrate 21 and the second substrate 22 is constant, the bonding available boundary A is shifted to the side of a high temperature as shown in FIG. 4.

It has also found that such a shift of the bonding available boundary A occurs with the amount of copper contained in each of the first bonding film 31 and the second bonding film 32 being decreased, that is, the amount of the organic component contained in each of the first bonding film 31 and the second bonding film 32 being increased. In other words, the bounding available boundary A is shifted to the upper side in the first quadrant of the orthogonal coordinate system shown in FIG. 4.

In this study, it is to be noted that a determination as to whether or not the first substrate 21 and the second substrate 22 are bonded together through the bonding film 3 is made as follows. In the case where the first substrate 21 and the second substrate 22 are not separated from each other, that is, the first bonding film 31 and the second bonding film 32 are peeled off from each other, it is determined that the first substrate 21 and the second substrate 22 are bonded together.

The inventors have further studied, and then have made a hypothesis as follows. The bonding virtual curve A and the bonding virtual curve B shown in FIG. 4 show that the bonding of the first bonding film 31 and the second bonding film 32 depends on a temperature.

Therefore, when the first bonding film 31 and the second bonding film 32 are bonded together, some sort of a chemical reaction occur in the bonding interface in which the first bonding film 31 and the second bonding film 32 are bonded together. The chemical reaction is considered to be an Arrhenius type reaction.

Here, Arrhenius equation is represented by the following formula (2) when a rate constant is defined as "k", an activation energy is defined as "Ea", a gas constant is defined as "R", and a frequency factor is defined as "A".

$$k = A \cdot \exp(-Ea/RT) \qquad (2)$$

Both the bonding virtual curve A and the bonding virtual curve B are subjected to a curve fitting so as to approximate Arrhenius equation. In this way, the bonding virtual curve A and the bonding virtual curve B can be represented by the formula (2). As a result, it has found that the activation energy Ea of the formula (2) represented by the bonding virtual curve A and the bonding virtual curve B can be approximated to $82 \times 10^3$ (J/mol).

In the case where the time for applying the compressive force to the first substrate 21 and the second substrate 22 is constant, the bonding available boundary A is shifted to the side of the high temperature as shown in FIG. 4.

Such a shift of the bonding available boundary A occurs with the amount of the organic component (impurity) contained in each of the first bonding film 31 and the second bonding film 32 being increased. Therefore, the inventors have assumed that there is a correlation between the frequency factor A and the amount X (atom %) of copper contained in each of the first bonding film 31 and the second bonding film 32.

As a result, the correlation between the frequency factor A and the amount X (atom %) of copper contained in each of the first bonding film 31 and the second bonding film 32 can be represented by the following formula (3).

$$A = 1.43 \times 10^9 \exp[-6.60 \times 10^{-2} (100 \times X)] \qquad (3)$$

In this way, the activation energy Ea and the frequency factor A have been obtained by using the above formulas (2) and (3). Thus, the inventors have found that the bonding virtual curve A and the bonding virtual curve B shown in FIG. 4 can be represented by the following one formula (4) which includes the amount of copper as a parameter.

$$1/Y \geq 1.43 \times 10^9 \exp[-6.60 \times 10^{-2}(100-X) - 82 \times 10^3/RT] \qquad (4)$$

If a relation of the formula (4) is satisfied, the time Y [minutes] for applying the compressive force to the first substrate 21 and the second substrate 22 and the temperature T [K] for heating the first bonding film 31 and the second bonding film 32 can be set so that they are positioned in the bonding area shown in FIG. 4 even if the amount X [atom %] of copper contained in each of the first bonding film 31 and the second bonding film 32 is changed in the range of 90 atom % or higher but lower than 99 atom %. This makes it possible to reliably bond the first bonding film 31 and the second bonding film 32 together.

As shown in FIG. 4, when the temperature for heating the first bonding film 31 and the second bonding film 32 is 150° C. (423K), the time Y [minutes] for applying the compressive force to the first substrate 21 and the second substrate 22 is 20 minutes, and the amount X (atom %) of copper contained in each of the first bonding film 31 and the second bonding film 32 is 90 atom %, a point (coordinate) of the temperature and the time is positioned in the bonding area shown in FIG. 4.

Therefore, the first bonding film 31 and the second bonding film 32 are bonded together, thereby bonding the first substrate 21 and the second substrate 22 together through the bonding film 3. However, the bonding strength between the first bonding film 31 and the second bonding film 32 can be improved by increasing at least one of the temperature T and the time Y as shown by the arrows in FIG. 4.

Further, in this step, that is, in the bonding processes of the first bonding film 31 and the second bonding film 32, it is supposed that the first bonding film 31 and the second bonding film 32 are bonded together by the following mechanism.

When the compressive force is applied to the first substrate 21 and the second substrate 22, first, the surface of the first bonding film 31 adheres to the surface of the second bonding film 32.

In the present invention, the first bonding film 31 and the second bonding film 32 are formed on the first substrate 21 and the second substrate 22, respectively, by using the chemical vapor-film formation method. They are constituted of copper and the organic component as described above. Therefore, it is supposed that active hands such as a dangling bond (non-bonding hand) exist to copper atoms randomly due to existence of the organic component contained in the each of the first bonding film 31 and the second bonding film 32.

Therefore, when the surface of the first bonding film 31 adheres to the surface of the second bonding film 32, the dangling bonds existing in the vicinity of the surfaces of the first bonding film 31 and the second bonding film 32 are bonded together.

The dangling bonds, which exist in the vicinity of the surfaces of the first bonding film 31 and the second bonding film 32, are intricately bonded together so as to entwine thereamong. Thus, since the dangling bonds are bonded together in a network manner, the copper atoms contained in the first bonding film 31 and the second bonding film 32 are directly bonded to each other. As a result, the first bonding film 31 and the second bonding film 32 are bonded together.

In this regard, it is to be noted that the fact that the bonding available boundary A is shifted to the side of the high temperature as shown in FIG. 4 with the amount of the organic component contained in each of the first bonding film 31 and the second bonding film 32 being increased is considered to result from the following reasons.

The dangling bonds are generated by existence of the organic component contained in each of the first bonding film 31 and the second bonding film 32. Then, the organic component bonds to the dangling bonds with the amount of the organic component contained in each of the first bonding film 31 and the second bonding film 32 being increased.

Therefore, in order to bond the dangling bonds together so as to entwine thereamong, first, after the organic component is removed from the first bonding film 31 and the second bonding film 32, the dangling bonds need to be bonded together. For this reason, it is supposed that the bonding available boundary A is shifted to the side of the high temperature as shown in FIG. 4.

In the meantime, in the present invention, the amount of copper contained in the bonding film 3 is 90 atom % or higher but lower than 99 atom %. In other words, the amount of the organic component contained in the bonding film 3 is 1 atom or higher but lower than 10 atom %. The reason why these ranges are set are as follows.

Both copper and the organic component are contained in the bonding film 3. If the amount of the organic component is large, cleavage can be generated within the bonding film 3. Even if an intensity of energy for peeling off (separation), which is applied to the bonding film 3, is made to be small when recycling the first substrate 21 and the second substrate 22 in a method of peeling off the bonding film 3 included in the bonded body 5 as described above, this cleavage can be generated.

Therefore, it is possible to improve a recycle rate of the first substrate 21 and the second substrate 22 of the bonded body 5.

However, if the amount of the organic component contained in each of the first bonding film 31 and the second bonding film 32 is large, it is required that the temperature T for heating the first bonding film 31 and the second bonding film 32, the time Y for applying the compressive force to the first substrate 21 and the second substrate 22, and the compressive force applied thereto are large when bonding the first substrate 21 and the second substrate 22 together through the first bonding film 31 and the second bonding film 32 as shown in FIG. 4.

In addition, there is a possibility that the constituent materials of the first substrate 21 and the second substrate 22 are altered and deteriorated and the production cost in obtaining the bonded body 5 is increased depending on the constituent materials of the first substrate 21 and the second substrate 22.

Therefore, the amount of the organic component contained in each of the first bonding film 31 and the second bonding film 32 is set so as to be 1 atom % or higher but lower than 10 atom % for the purpose of preventing or suppressing demerits reliably and obtaining merits reliably. In other words, the amount of copper contained in each of the first bonding film 31 and the second bonding film 32 is set so as to be 90 atom % or higher but lower than 99 atom %.

The demerits are obtained by including a large amount of the organic component in the first bonding film 31 and the second bonding film 32. The merits are obtained by including a small amount of the organic component in the first bonding film 31 and the second bonding film 32.

In this regard, it is to be noted that the compressive force may be applied to the first substrate 21 and the second substrate 22 in any atmosphere. Examples of such an atmosphere include an air atmosphere, an oxidized gas atmosphere such as an oxygen atmosphere, a reduced gas atmosphere such as a hydrogen atmosphere, an inert gas atmosphere such as a nitrogen atmosphere and an argon atmosphere, a reduced pressure (vacuum) atmosphere which is obtained by reducing a pressure in these atmospheres, and the like.

Among these atmospheres mentioned above, the air atmosphere is preferable. This makes it possible to easily apply the compressive force to the first substrate 21 and the second substrate 22 due to no cost and no labor hour which are needed to control the atmosphere.

It is demanded that the first substrate 21 and the second substrate 22 of the bonded body 5 is recycled after use of the bonded body 5 obtained by using the method of forming the bonded body 5 according to the present invention as described above from a view point of the environment. It is preferred that each of the first substrate 21 and the second substrate 22 is separated from the bonded body 5 and then recycled in order to improve the recycle rate thereof.

Under such a circumstance, it is possible to separate the first substrate 21 and the second substrate 22 from the bonded body 5 by using a method of peeling off the bonding film 3 included in the bonded body 5, in which energy for peeling off is applied to the bonding film 3 of the bonded body 5.

When the energy for peeling off is applied to the bonding film 3 provided with the bonded body 5, a part of molecular bonds in the bonding film 3 constituted of copper and the organic component is cut. As a result, cleavage is generated within the bonding film 3, thereby enabling the first substrate 21 and the second substrate 22 to be separated from each other. Thus, it is possible to recycle the first substrate 21 and the second substrate 22 by separating them.

Here, the following mechanism is supposed as a mechanism in which cleavage is generated within the bonding film 3 by applying the energy for peeling off to the bonding film 3. When the energy for peeling off is applied to the bonding film 3, Cu—$CH_3$ bonds existing in the bonding film 3 constituted of copper and the organic component are cut to obtain —$CH_3$ groups.

The obtained —$CH_3$ groups are reacted with water molecular or the like in the atmosphere (bonding film 3) to thereby produce methane. Methane is a gas (methane gas) and has large volume. Therefore, pressure is applied to directions of the outside of the bonded body 5 in a part of the bonding film 3 in which the gas (namely methane) is generated due to the methane. As a result, Cu—Cu bonds are also cut, thereby generating cleavage within the bonding film 3.

The atmosphere when the energy for peeling off is applied to the bonding film 3 is not particularly limited to a specific atmosphere as long as a water molecular is included in the atmosphere. But the atmosphere is preferably an air atmosphere. In the case where the energy for peeling off is applied to the bonding film 3 in the air atmosphere, a specific apparatus is not needed to carry out the energy applying process.

Further, since a sufficient amount of the water molecular is contained in the air atmosphere, it is possible to reliably generate cleavage within the bonding film 3.

The energy for peeling off may be applied to the bonding film 3 by any method. Examples of the method include: a method in which an energy beam is irradiated on the bonding film 3; a method in which the bonding film 3 is heated; a method in which a compressive force (physical energy) is applied to the bonding film 3; a method in which the bonding film 3 is exposed to plasma (that is, plasma energy is applied to the bonding film 3); a method in which the bonding film 3 is exposed to an ozone gas (that is, chemical energy is applied to the bonding film 3); and the like.

Among these methods, in the case where at least one of the first substrate 21 and the second substrate 22 has energy-beam permeation property, it is particularly preferred that the method in which the energy beam is irradiated on the bonding film 3 is used as the method in which the energy for peeling off is applied to the bonding film 3.

Since such a method can selectively and relatively easily apply the energy for peeling off to the bonding film 3, it is possible to reliably generate the cleavage within the bonding film 3. Further, in the case where both the first substrate 21 and the second substrate 22 do not have the energy-beam permeation property, the method in which the bonding film 3 is heated is suitably used as the method of applying the energy for peeling off to the bonding film 3.

The energy beam is not particularly limited to a specific beam, but is preferably light such as an ultraviolet ray and a laser light. This makes it possible to reliably generate the cleavage within the bonding film 3 while preventing the first substrate 21 and the second substrate 22 from being altered or deteriorated.

A wavelength of the ultraviolet ray is preferably in the range of about 126 to 300 nm and more preferably in the range of about 126 to 200 nm.

In the case where a UV lamp is used, power of the UV lamp is preferably in the range of about 1 $mW/cm^2$ to 1 $W/cm^2$ and more preferably in the range of about 5 to 50 $mW/cm^2$, although being different depending on an area of the surface of the bonding film 3. In this case, a distance between the UV lamp and the bonding film 3 is preferably in the range of about 3 to 3000 mm and more preferably in the range of about 10 to 1000 mm.

Further, a time for irradiating the ultraviolet ray is set to a time required for generation of the cleavage within the bonding film 3. Specifically, the time is preferably for a length of time from about 10 to 180 minutes and more preferably for a length of time from about 30 to 60 minutes, although being slightly different depending on an amount of the ultraviolet ray, the constituent material of the bonding film 3, and the like.

In the case where the bonding film 3 is heated, a heating temperature of the bonded body 5 is preferably in the range of about 100 to 400° C. and more preferably in the range of about 150 to 300° C. By heating the bonded body 5 in such a heating temperature range, it is possible to reliably generate the cleavage within the bonding film 3 while preventing alteration and deterioration of the first substrate 21 and the second substrate 22 reliably.

Further, a heating time is set to a time for generating the cleavage within the bonding film 3. Specifically, the time is preferably for a length of time from about 10 to 180 minutes and more preferably for a length of time from about 30 to 60 minutes, although being slightly different depending on the heating temperature, the constituent material of the bonding film 3, and the like.

In this way, by using an easy method, that is, the above method of applying the energy for peeling off to the bonding film 3, the first substrate 21 and the second substrate 22 can be separated from the bonded body 5 effectively.

Therefore, even if the constituent materials of the first substrate 21 and the second substrate 22 are different from each other, they can be reused independently after fractionation thereof. This makes it possible to improve the recycle rate of the first substrate 21 and the second substrate 22 of the bonded body 5.

Furthermore, the method of forming the bonded body according to the present invention described above can be used in bonding different kinds of members together.

Examples of an article (a bonded body) to be manufactured by such a method of forming the bonded body include: semiconductor devices such as a transistor, a diode and a memory; piezoelectric devices such as a crystal oscillator and a surface acoustic wave device; optical devices such as a reflecting mirror, an optical lens, a diffraction grating and an optical filter; photoelectric conversion devices such as a solar cell; semiconductor substrates having semiconductor devices mounted thereon; insulating substrates having wirings or electrodes formed thereon; ink-jet type recording heads; parts of micro electromechanical systems such as a micro reactor and a micro mirror; sensor parts such as a pressure sensor and an acceleration sensor; package parts of semiconductor devices or electronic components; recording media such as a magnetic recording medium, a magneto-optical recording medium and an optical recording medium; parts for display devices such as a liquid crystal display device, an organic EL device and an electrophoretic display device; parts for fuel cells; and the like.

Droplet Ejection Head

Now, a description will be made on an embodiment of a droplet ejection head in which the bonded body formed by using the method of forming the bonded body according to the present invention is used.

Figure 5:
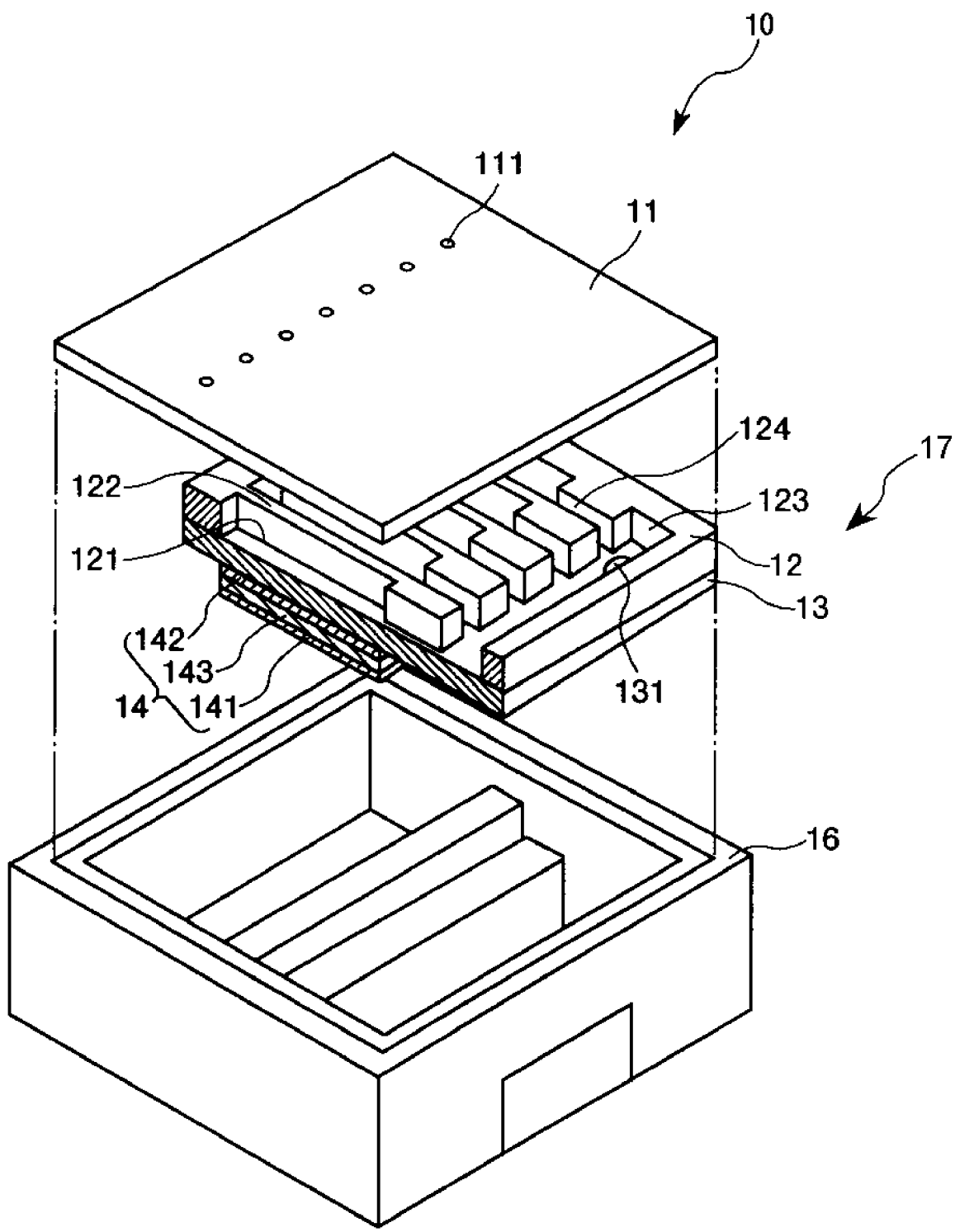
FIG. 5 is an exploded perspective view showing an ink jet type recording head (a droplet ejection head) in which a bonded body according to the present invention is used.
Figure 6:
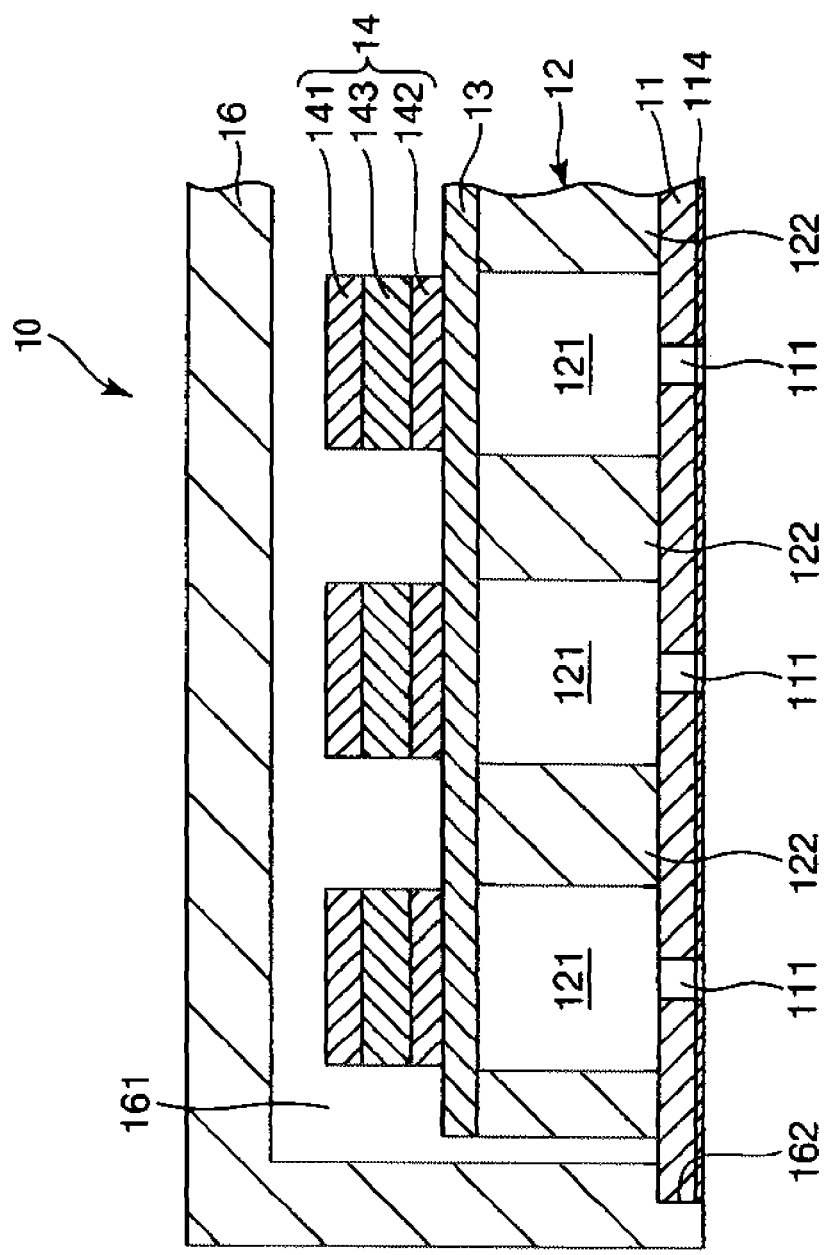
FIG. 6 is a section view illustrating major parts of the ink jet type recording head shown in FIG. 5.

FIG. 5 is an exploded perspective view showing an ink jet type recording head (a droplet ejection head) in which the bonded body according to the present invention is used. FIG. 6 is a section view illustrating major parts of the ink jet type recording head shown in FIG. 5.

Figure 7:
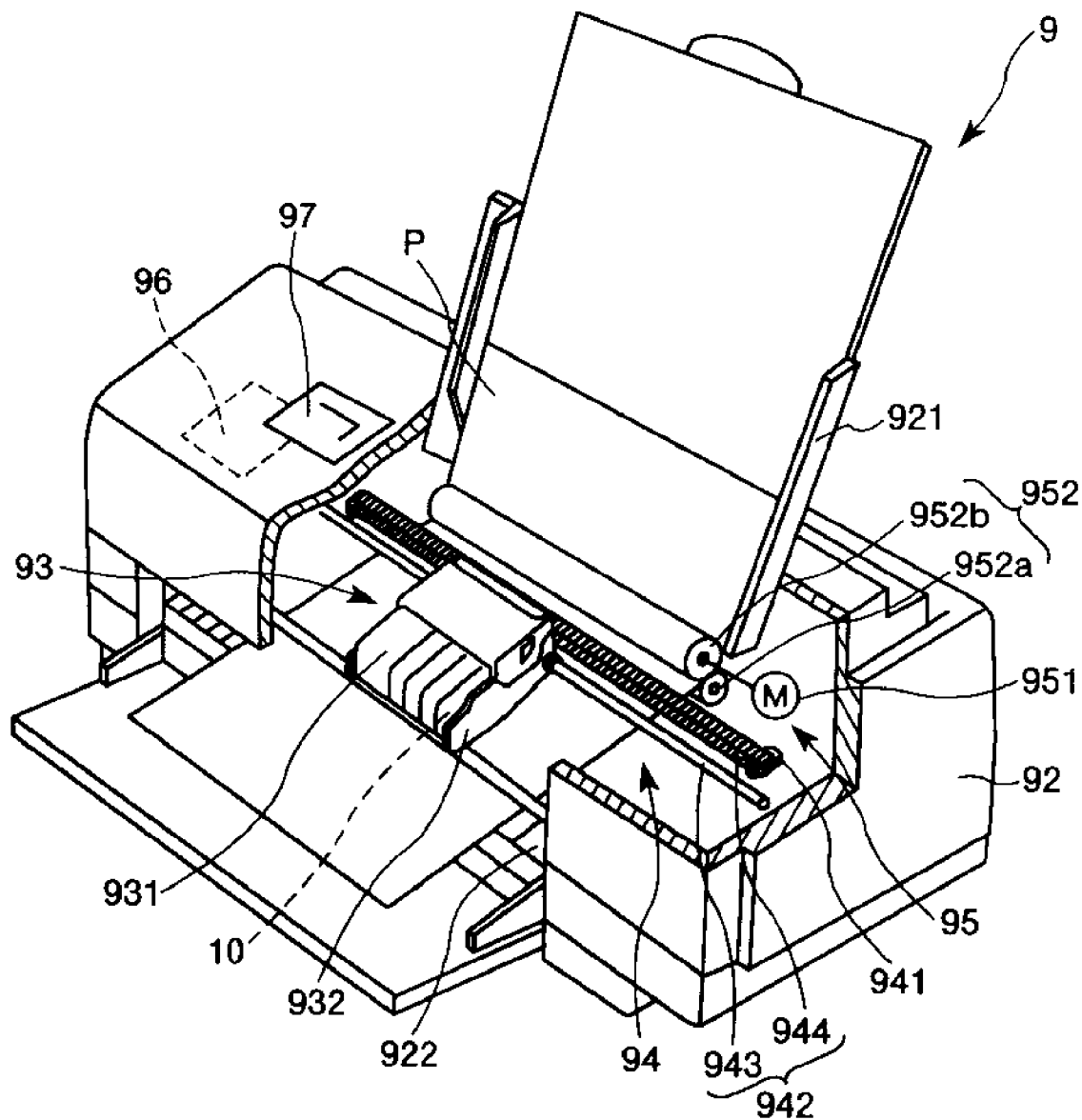
FIG. 7 is a schematic view showing one embodiment of an ink jet printer provided with the ink jet type recording head shown in FIG. 5.

FIG. 7 is a schematic view showing one embodiment of an ink jet printer provided with the ink jet type recording head shown in FIG. 5. In FIG. 5, the ink jet type recording head is shown in an inverted state as distinguished from a typical use state.

The ink jet type recording head 10 shown in FIG. 5 is mounted to the ink jet printer 9 shown in FIG. 7.

The ink jet printer 9 shown in FIG. 7 includes a printer body 92, a tray 921 provided in the upper rear portion of the printer body 92 for holding recording paper sheets P, a paper discharging port 922 provided in the lower front portion of the printer body 92 for discharging the recording paper sheets P therethrough, and an operation panel 97 provided on the upper surface of the printer body 92.

The operation panel 97 is formed from, e.g., a liquid crystal display, an organic EL display, an LED lamp or the like. The operation panel 97 includes a display portion (not shown) for displaying an error message and the like and an operation portion (not shown) formed from various kinds of switches.

Within the printer body 92, there are provided a printing device (a printing means) 94 having a reciprocating head unit 93, a paper sheet feeding device (a paper sheet feeding means) 95 for feeding the recording paper sheets P into the printing device 94 one by one and a control unit (a control means) 96 for controlling the printing device 94 and the paper sheet feeding device 95.

Under the control of the control unit 96, the paper sheet feeding device 95 feeds the recording paper sheets P one by one in an intermittent manner. The recording paper sheet P passes near the lower portion of the head unit 93. At this time, the head unit 93 makes reciprocating movement in a direction generally perpendicular to the feeding direction of the recording paper sheet P, thereby printing the recording paper sheet P.

In other words, an ink jet type printing operation is performed, during which time the reciprocating movement of the head unit 93 and the intermittent feeding of the recording paper sheets P act as primary scanning and secondary scanning, respectively.

The printing device 94 includes a head unit 93, a carriage motor 941 serving as a driving power source of the head unit 93 and a rotated by the carriage motor 941 for reciprocating the head unit 93.

The head unit 93 includes an ink jet type recording head 10 (hereinafter, simply referred to as "a head 10") having a plurality of formed in the lower portion thereof, an ink cartridge 931 for supplying ink to the head 10 and a carriage 932 carrying the head 10 and the ink cartridge 931.

Full color printing becomes available by using, as the ink cartridge 931, a cartridge of the type filled with ink of four colors, i.e., yellow, cyan, magenta and black.

The reciprocating mechanism 942 includes a carriage guide shaft 943 whose opposite ends are supported on a frame (not shown) and a timing belt 944 extending parallel to the carriage guide shaft 943.

The carriage 932 is reciprocatingly supported by the carriage guide shaft 943 and fixedly secured to a portion of the timing belt 944.

If the timing belt 944 wound around a pulley is caused to run in forward and reverse directions by operating the carriage motor 941, the head unit 93 makes reciprocating movement along the carriage guide shaft 943. During this reciprocating movement, an appropriate amount of ink is ejected from the head 10 to print the recording paper sheets P.

The paper sheet feeding device 95 includes a paper sheet feeding motor 951 serving as a driving power source thereof and a pair of paper sheet feeding rollers 952 rotated by means of the paper sheet feeding motor 951.

The paper sheet feeding rollers 952 include a driven roller 952a and a driving roller 952b, both of which face toward each other in a vertical direction, with a paper sheet feeding path (the recording paper sheet P) remained therebetween. The driving roller 952b is connected to the paper sheet feeding motor 951.

Thus, the paper sheet feeding rollers 952 are able to feed the plurality of recording paper sheets P, which are held in the tray 921, toward the printing device 94 one by one. In place of the tray 921, it may be possible to employ a construction that can removably hold a paper sheet feeding cassette containing the recording paper sheets P.

The control unit 96 is designed to perform printing by controlling the printing device 94 and the paper sheet feeding device 95 based on the printing data inputted from a host computer, e.g., a personal computer or a digital camera.

Although not shown in the drawings, the control unit 96 is mainly comprised of a memory that stores a control program for controlling the respective parts and the like, a piezoelectric element driving circuit for driving piezoelectric elements (vibration sources) 14 to control an ink ejection timing, a driving circuit for driving the printing device 94 (the carriage motor 941), a driving circuit for driving the paper sheet feeding device 95 (the paper sheet feeding motor 951), a communication circuit for receiving printing data from a host computer, and a CPU electrically connected to the memory and the circuits for performing various kinds of control with respect to the respective parts.

Electrically connected to the CPU are a variety of sensors capable of detecting, e.g., the remaining amount of ink in the ink cartridge 931 and the position of the head unit 93.

The control unit 96 receives printing data through the communication circuit and then stores them in the memory. The CPU processes these printing data and outputs driving signals to the respective driving circuits, based on the data thus processed and the data inputted from the variety of sensors. Responsive to these signals, the piezoelectric elements 14, the printing device 94 and the paper sheet feeding device 95 come into operation, thereby printing the recording paper sheets P.

Hereinafter, the head 10 will be described in detail with reference to FIGS. 5 and 6.

The head 10 includes a head main body 17 and a base body 16 for receiving the head main body 17. The head main body 17 includes a nozzle plate 11, an ink chamber base plate 12, a vibration plate 13 and a plurality of piezoelectric elements (vibration sources) 14 bonded to the vibration plate 13. The head 10 constitutes a piezo jet type head of on-demand style.

The nozzle plate 11 is made of, e.g., a silicon-based material such as $SiO_2$, SiN or quartz glass, a metallic material such as Al, Fe, Ni, Cu or alloy containing these metals, an oxide-based material such as alumina or ferric oxide, a carbon-based material such as carbon black or graphite, and the like.

A plurality of nozzle holes 111 for ejecting ink droplets therethrough is formed in the nozzle plate 11. The pitch of the nozzle holes 111 is suitably set according to the degree of printing accuracy.

The ink chamber base plate 12 is fixed or secured to the nozzle plate 11. In the ink chamber base plate 12, there are formed a plurality of ink chambers (cavities or pressure chambers) 121, a reservoir chamber 123 for reserving ink supplied from the ink cartridge 931 and a plurality of supply ports 124 through which ink is supplied from the reservoir chamber 123 to the respective ink chambers 121. These chambers 121, 123 and 124 are defined by the nozzle plate 11, the side walls (barrier walls) 122 and the below mentioned vibration plate 13.

The respective ink chambers 121 are formed into a reed shape (a rectangular shape) and are arranged in a corresponding relationship with the respective nozzle holes 111. Volume of each of the ink chambers 121 can be changed in response to vibration of the vibration plate 13 as described below. Ink is ejected from the ink chambers 121 by virtue of this volume change.

As a base material of which the ink chamber base plate 12 is made, it is possible to use, e.g., a monocrystalline silicon substrate, various kinds of glass substrates or various kinds of resin substrates. Since these substrates are all generally used in the art, use of these substrates makes it possible to reduce manufacturing cost of the head 10.

The vibration plate 13 is bonded to the opposite side of the ink chamber base plate 12 from the nozzle plate 11. The plurality of piezoelectric elements 14 are provided on the opposite side of the vibration plate 13 from the ink chamber base plate 12.

In a predetermined position of the vibration plate 13, a communication hole 131 is formed through a thickness of the vibration plate 13. Ink can be supplied from the ink cartridge 931 to the reservoir chamber 123 through the communication hole 131.

Each of the piezoelectric elements 14 includes an upper electrode 141, a lower electrode 142 and a piezoelectric body layer 143 interposed between the upper electrode 141 and the lower electrode 142. The piezoelectric elements 14 are arranged in alignment with the generally central portions of the respective ink chambers 121.

The piezoelectric elements 14 are electrically connected to the piezoelectric element driving circuit and are designed to be operated (vibrated or deformed) in response to the signals supplied from the piezoelectric element driving circuit.

The piezoelectric elements 14 act as vibration sources. The vibration plate 13 is vibrated by operation of the piezoelectric elements 14 and has a function of instantaneously increasing internal pressures of the ink chambers 121.

The base body 16 is made of, e.g., various kinds of resin materials or various kinds of metallic materials. The nozzle plate 11 is fixed to and supported by the base body 16. Specifically, in a state that the head main body 17 is received in a recess portion 161 of the base body 16, an edge of the nozzle plate 11 is supported on a shoulder 162 of the base body 16 extending along an outer circumference of the recess portion 161.

When bonding the nozzle plate 11 and the ink chamber base plate 12, the ink chamber base plate 12 and the vibration plate 13, and the nozzle plate 11 and the base body 16 as mentioned above, the method of forming the bonded body according to the present invention is used in at least one bonding point.

In other words, the bonded body of the present invention is used in at least one of a bonded body in which the nozzle plate 11 and the ink chamber base plate 12 are bonded together, a bonded body in which the ink chamber base plate 12 and the vibration plate 13 are bonded together, and a bonded body in which the nozzle plate 11 and the base body 16 are bonded together.

The head 10 described above exhibits increased bonding strength and chemical resistance in a bonding interface of the bonded portion, which in turn leads to increased durability and liquid tightness against the ink reserved in the respective ink chambers 121. As a result, the head 10 is rendered highly reliable.

Furthermore, highly reliable bonding is available even at an extremely low temperature. This is advantageous in that a head with an increased area can be fabricated from those materials having different linear expansion coefficients.

With the head 10 set forth above, no deformation occurs in the piezoelectric body layer 143 in the case where a predetermined ejection signal has not been inputted from the piezoelectric element driving circuit, that is, a voltage has not been applied between the upper electrode 141 and the lower electrode 142 of each of the piezoelectric elements 1.

For this reason, no deformation occurs in the vibration plate 13 and no change occurs in the volumes of the ink chambers 121. Therefore, ink droplets have not been ejected from the nozzle holes 111.

On the other hand, the piezoelectric body layer 143 is deformed in the case where a predetermined ejection signal is inputted from the piezoelectric element driving circuit, that is, a voltage is applied between the upper electrode 141 and the lower electrode 142 of each of the piezoelectric elements 1.

Thus, the vibration plate 13 is heavily deflected to change the volumes of the ink chambers 121. At this moment, the pressures within the ink chambers 121 are instantaneously increased and ink droplets are ejected from the nozzle holes 111.

When one ink ejection operation has ended, the piezoelectric element driving circuit ceases to apply a voltage between the upper electrode 141 and the lower electrode 142. Thus, the piezoelectric elements 14 are returned substantially to their original shapes, thereby increasing the volumes of the ink chambers 121.

At this time, a pressure acting from the ink cartridge 931 toward the nozzle holes 111 (a positive pressure) is imparted to the ink. This prevents an air from entering the ink chambers 121 through the nozzle holes 111, which ensures that the ink is supplied from the ink cartridge 931 (the reservoir chamber 123) to the ink chambers 121 in a quantity corresponding to the quantity of ink ejected.

By sequentially inputting ejection signals from the piezoelectric element driving circuit to the piezoelectric elements 14 lying in target printing positions, it is possible to print an arbitrary (desired) letter, figure or the like.

The head 10 may be provided with thermoelectric conversion elements in place of the piezoelectric elements 14. In other words, the head 10 may have a configuration in which ink is ejected using the thermal expansion of a material caused by thermoelectric conversion elements (which is sometimes called a bubble jet method wherein the term "bubble jet" is a registered trademark).

In the head 10 configured as above, a film 114 is formed on the nozzle plate 11 in an effort to impart liquid repellency thereto. By doing so, it is possible to reliably prevent ink droplets from adhering to peripheries of the nozzle holes 111, which would otherwise occur when the ink droplets are ejected from the nozzle holes 111.

As a result, it becomes possible to make sure that the ink droplets ejected from the nozzle holes 111 are reliably landed (hit) on target regions.

Wiring Board

Now, a description will be made on an embodiment of a wiring board in which the bonded body according to the present invention is used.

Figure 8:
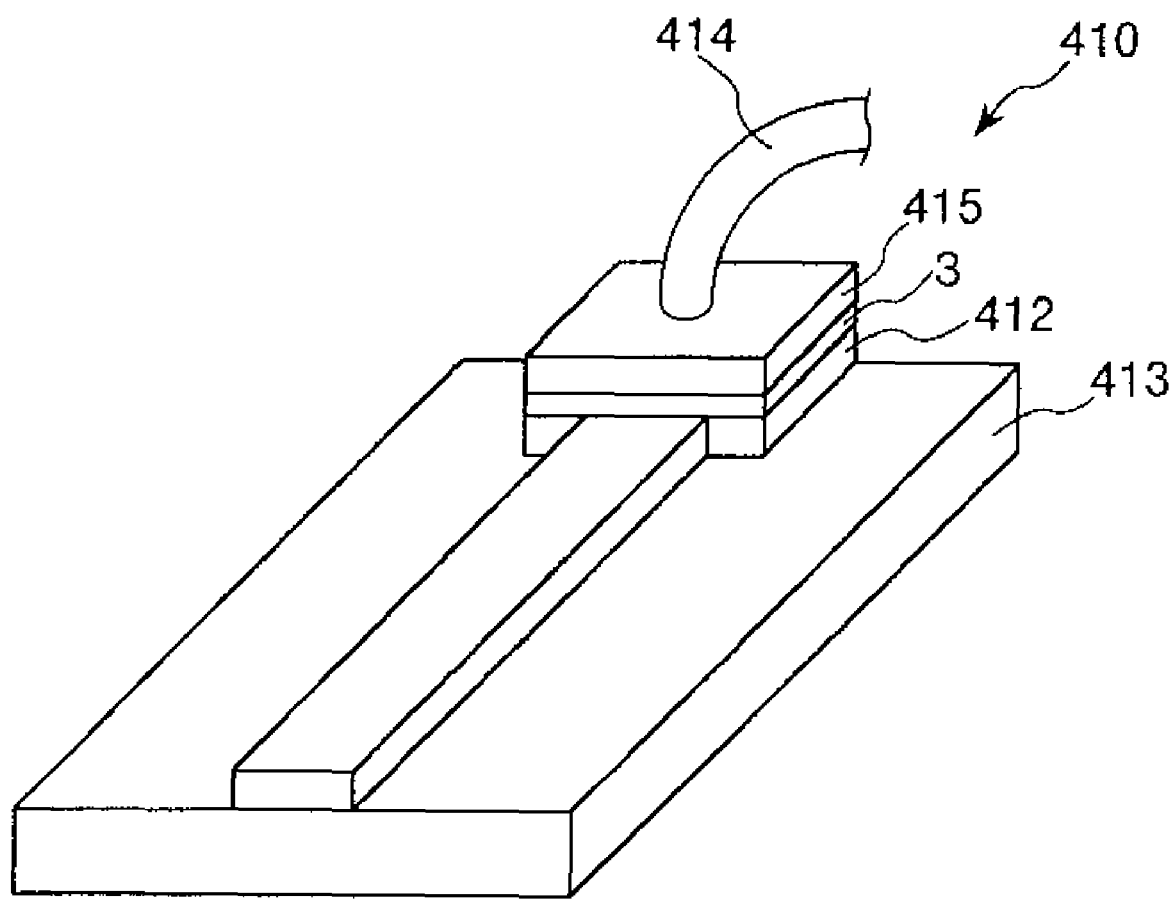
FIG. 8 is a perspective view showing a wiring board in which a bonded body according to the present invention is used.

FIG. 8 is a perspective view showing a wiring board in which the bonded body according to the present invention is used.

A wiring board 410 shown in FIG. 8 includes an insulated board 413, an electrode 412 provided on the insulated board 413, a lead 414, an electrode 415 provided at one end of the lead 414 so as to be opposed to the electrode 412.

Further, the first bonding film 31 and the second bonding film 32 are respectively formed on an upper surface of the electrode 412 and a lower surface of the electrode 415. The electrode 412 and the electrode 415 are bonded together through the first bonding film 31 and the second bonding film 32 which are bonded together by using the method of forming the bonded body according to the present invention as described above.

Thus, the electrode 412 and the electrode 415 are firmly bonded together by a single layer of a bonding film 3 which is obtained by bonding the first bonding film 31 and the second bonding film 32 together. This makes it possible to reliably prevent delamination (separation) between the electrodes 412 and 415 or the like, and to obtain a wiring board 410 having high reliability.

Further, the bonding film 3 contains copper, and also has a function of conducting between the electrodes 412 and 415.

Moreover, a thickness of the bonding film 3 can be easily controlled with high accuracy as described above. This makes it possible to obtain a wiring board 410 having higher dimensional accuracy and to easily control electrical conductivity between the electrodes 412 and 415.

Although the method of forming the bonded body and the bonded body according to the present invention have been described above based on the embodiments illustrated in the drawings, the present invention is not limited thereto.

As an alternative example, the method of forming the bonded body according to the present invention may be a combination of two or more of the foregoing embodiments. Further, if necessary, one or more arbitrary step may be added in the method of forming the bonded body according to the present invention.

Furthermore, although cases that two substrates (e.g., the first substrate and the second substrate) are bonded together has been described in the above embodiments, but not limited thereto, the method of forming the bonded body of the present invention can be used in a case that three or more substrates are bonded together.

EXAMPLES

Next, a description will be made on a number of concrete examples of the present invention.

1. Manufacturing Bonded Body

Example 1

First, a first monocrystalline silicon substrate having a length of 20 mm, a width of 20 mm and an average thickness of 1 mm was prepared as a first substrate. A second monocrystalline silicon substrate having a length of 20 mm, a width of 10 mm and an average thickness of 1 mm was also prepared as a second substrate.

Next, surfaces of the first monocrystalline silicon substrate and the second monocrystalline silicon substrate were subjected to a thermal oxidation treatment to thereby obtain thermally oxidized films each having a thickness of 100 nm. Then, titanium thin films having a thickness of 20 nm were formed on surfaces of thermally oxidized films by using a sputtering method, respectively. Thereafter, surfaces of titanium thin films were subjected to a surface treatment.

Next, the first monocrystalline silicon substrate and the second monocrystalline silicon substrate which were subjected to the surface treatment were placed into a chamber 211 of the film forming apparatus 200 shown in FIG. 3. Then, a bonding film having an average thickness of 100 nm, which was constituted of copper and an organic component, was formed on the surface of the titanium thin film of each of the first monocrystalline silicon substrate and the second monocrystalline silicon substrate by using bis(2,6-dimethyl-2-(trimethylsilyloxy)-3,5-heptadionato) copper (II) ($Cu(sopd)_2$) as a raw material with a MOCVD method.

Film Forming Conditions

An atmosphere within the chamber is a nitrogen gas and a hydrogen gas, an organic metal material (raw material) is $Cu(sopd)_2$, a flow rate of the atomized organic metal material is 1 g/min, a carrier gas is a nitrogen gas, a pressure within the chamber during the film formation is 20 Torr, a partial pressure of hydrogen during the film formation is 14 Torr, a temperature of a substrate holder is 270° C., and a processing time is 10 minutes.

The bonding film formed on the surface of each of the titanium thin films as described above was constituted of copper and an organic component. Each bonding film was subjected to a mass spectroscope to measure an amount of copper contained therein by using a secondary-ion mass spectrometry (SIMS method).

As a result, the amount of copper contained in each of the bonding films was 98 atom %. By using the steps as described above, each bonding film constituted of copper and the organic component could be formed on the respective first and second monocrystalline silicon substrates through the thermally oxidized film and the titanium thin film.

Next, the first monocrystalline silicon substrate was laminated with the second monocrystalline silicon substrate so that the bonding film provided on the first monocrystalline silicon substrate was in contact with the bonding film provided on the second monocrystalline silicon substrate.

In this sate, a compressive force of 50 MPa was applied to the first monocrystalline silicon substrate and the second monocrystalline silicon substrate for 5 minutes while heating the bonding films at a temperature of 175° C.

As a result, the bonding film provided on the first monocrystalline silicon substrate was bonded to the bonding film provided on the second monocrystalline silicon substrate under the conditions which satisfy a relation of the formula (1) described above.

In this way, a bonded body in which the first monocrystalline silicon substrate and the second monocrystalline silicon substrate were bonded together through a bonded bonding film obtained by bonding the bonding films together was obtained.

Examples 2 to 7

In each of the Examples 2 to 7, a bonded body was obtained in the same manner as Example 1 except that the time for applying the compressive force to the first monocrystalline silicon substrate and the second monocrystalline silicon substrate and the temperature for heating the bonding films were changed to conditions as shown in Table 1. In this regard, it is to be noted that these conditions satisfied the relation of the formula (1) described above.

Example 8

A bonded body was obtained in the same manner as Example 1 except that the film formation conditions for forming the bonding films constituted of copper and the organic component were changed to the following conditions.

Film Forming Conditions

An atmosphere within the chamber is a nitrogen gas and a hydrogen gas, an organic metal material (raw material) is $Cu(sopd)_2$, a flow rate of the atomized organic metal material is 1 g/min, a carrier gas is a nitrogen gas, a pressure within the chamber during the film formation is 15 Torr, a partial pressure of hydrogen during the film formation is 8 Torr, a temperature of the substrate holder is 270° C., and a processing time is 10 minutes.

The bonding film formed on the surface of each of the titanium thin films as described above was constituted of copper and an organic component. Each bonding film was subjected to a mass spectroscope to measure an amount of copper contained therein by using a secondary-ion mass spectrometry (SIMS method). As a result, the amount of copper contained in each of the bonding films was 90 atom %.

Examples 9 to 16

In each of the Examples 9 to 16, a bonded body was obtained in the same manner as Example 8 except that the time for applying the compressive force to the first monocrystalline silicon substrate and the second monocrystalline silicon substrate and the temperature for heating the bonding films were changed to conditions as shown in Table 1. In this regard, it is to be noted that these conditions satisfied the relation of the formula (1) described above.

Comparative Examples 1 to 5

In each of the Comparative Examples 1 to 5, a bonded body was obtained in the same manner as Example 1 except that the time for applying the compressive force to the first monocrystalline silicon substrate and the second monocrystalline silicon substrate and the temperature for heating the bonding films were changed to conditions as shown in Table 1. In this regard, it is to be noted that these conditions did not satisfy the relation of the formula (1) described above.

Comparative Examples 6 to 12

In each of the Comparative Examples 6 to 12, a bonded body was obtained in the same manner as Example 8 except that the time for applying the compressive force to the first monocrystalline silicon substrate and the second monocrystalline silicon substrate and the temperature for heating the bonding films were changed to conditions as shown in Table 1. In this regard, it is to be noted that these conditions did not satisfy the relation of the formula (1) described above.

2. Evaluation of Bonded Body 2.1 Evaluation of Peeling Off Between Bonding Films In the bonded body obtained in each of the Examples 1 to 16 and the Comparative Examples 1 to 12, a phenomenon was observed as to whether or not the bonding films included in the bonded body were peeled from each other. Then, such a phenomenon was evaluated according to the following two criteria A and B.

Evaluation Criteria of Peeling Off of Bonding Films

A: Peeling off between the bonding films was not observed.

B: Peeling off between the bonding films was observed.

2.2 Evaluation of Electric Resistivity

In the bonded body obtained in each of the Examples 1 to 16 and the Comparative Examples 1 to 12, electrodes were provided to end portions of the bonded body, namely outer surfaces of the first monocrystalline silicon substrate and the second monocrystalline silicon substrate of the bonded body, respectively. Then, a voltage was applied across the electrodes. Then, by measuring an electric resistivity between the electrodes, an electric resistivity of the bonded body was obtained. Thereafter, the obtained electric resistivity was evaluated according to the following four criteria A to D.

Evaluation Criteria of Electric Resistivity

A: Electric resistivity was lower than $1 \times 10^{-5}$ Ω·cm.

B: Electric resistivity was $1 \times 10^{-5}$ Ω·cm or higher but lower than $1 \times 10^{-3}$ Ω·cm.

C: Electric resistivity was $1 \times 10^{-3}$ Ω·cm or higher but lower than $1 \times 10^{-1}$ Ω·cm.

D: Electric resistivity was $1 \times 10^{-1}$ Ω·cm or higher.

The evaluation results in the item 2.1 and the item 2.2 are shown in Table 1.

TABLE 1

| | Forming conditions of bonded body | | | | | | | Evaluation results | |
|---|---|---|---|---|---|---|---|---|---|
| | Constituent material of first base member | Material for forming bonding films | Amount of copper | Constituent material of second base member | Compressive force | Time for applying compressive force | Temperature for heating bonding films | Peeling between bonding films | Electric resistivity |
| Ex. 1 | Silicon | Cu(sopd)$_2$ | 98 atom % | Silicon | 50 MPa | 5 min. | 175° C. | A | B |
| Ex. 2 | | | 98 atom % | | | 10 min. | 165° C. | A | A |
| Ex. 3 | | | 98 atom % | | | 15 min. | 150° C. | A | A |
| Ex. 4 | | | 98 atom % | | | 15 min. | 175° C. | A | A |
| Ex. 5 | | | 98 atom % | | | 20 min. | 150° C. | A | A |
| Ex. 6 | | | 98 atom % | | | 30 min. | 130° C. | A | A |
| Ex. 7 | | | 98 atom % | | | 60 min. | 120° C. | A | B |
| Ex. 8 | | | 90 atom % | | | 5 min. | 175° C. | A | B |
| Ex. 9 | | | 90 atom % | | | 10 min. | 150° C. | A | B |
| Ex. 10 | | | 90 atom % | | | 10 min. | 165° C. | A | A |
| Ex. 11 | | | 90 atom % | | | 15 min. | 150° C. | A | A |
| Ex. 12 | | | 90 atom % | | | 15 min. | 175° C. | A | A |
| Ex. 13 | | | 90 atom % | | | 20 min. | 140° C. | A | B |
| Ex. 14 | | | 90 atom % | | | 20 min. | 150° C. | A | B |
| Ex. 15 | | | 90 atom % | | | 30 min. | 150° C. | A | A |
| Ex. 16 | | | 90 atom % | | | 60 min. | 130° C. | A | B |
| Comp. Ex. 1 | Silicon | Cu(sopd)$_2$ | 98 atom % | Silicon | 50 MPa | 5 min. | 150° C. | B | D |
| Comp. Ex. 2 | | | 98 atom % | | | 10 min. | 130° C. | B | D |
| Comp. Ex. 3 | | | 98 atom % | | | 15 min. | 130° C. | B | D |
| Comp. Ex. 4 | | | 98 atom % | | | 30 min. | 120° C. | B | D |
| Comp. Ex. 5 | | | 98 atom % | | | 60 min. | 100° C. | B | D |

TABLE 1-continued

| | Forming conditions of bonded body | | | | | | Evaluation results | |
|---|---|---|---|---|---|---|---|---|
| | Constituent material of first base member | Material for forming bonding films | Amount of copper | Constituent material of second base member | Compressive force | Time for applying compressive force | Temperature for heating bonding films | Peeling between bonding films | Electric resistivity |
| Comp. Ex. 6 | | | 90 atom % | | | 2.5 min. | 150° C. | B | D |
| Comp. Ex. 7 | | | 90 atom % | | | 2.5 min. | 175° C. | B | D |
| Comp. Ex. 8 | | | 90 atom % | | | 5 min. | 150° C. | B | D |
| Comp. Ex. 9 | | | 90 atom % | | | 10 min. | 130° C. | B | D |
| Comp. Ex. 10 | | | 90 atom % | | | 15 min. | 130° C. | B | D |
| Comp. Ex. 11 | | | 90 atom % | | | 30 min. | 130° C. | B | D |
| Comp. Ex. 12 | | | 90 atom % | | | 60 min. | 120° C. | B | D |

As shown in Table 1, the fact that the bonding films were peeled from each other was observed in the bonded body obtained in each of the Comparative Examples 1 to 12. In contrast, the fact that the bonding films were peeled from each other was not observed in the bonded body obtained in each of the Examples 1 to 16.

Further, the electric resistivity of the bonded body obtained in each of the Examples 1 to 16 was lower than that of the bonded body obtained in each of the Comparative Examples 1 to 12. Furthermore, the conductive characteristics of the bonded body obtained in each of the Examples 1 to 16 were superior to that of the bonded body obtained in each of the Comparative Examples 1 to 12.

What is claimed is:

1. A method of forming a bonded body comprised of a first base member, a second base member, and a first bonding film and a second bonding film provided between the first base member and the second base member, wherein the first bonding film and the second bonding film are constituted of copper and an organic component, and an amount of copper contained in each of the first bonding film and the second bonding film is 90 atom % or higher but lower than 99 atom % at an atomic ratio, wherein the method comprising:

forming the first bonding film on the first base member by using a chemical vapor-film formation method;

forming the second bonding film on the second base member by using a chemical vapor-film formation method;

bringing the first bonding film formed on the first base member into contact with the second bonding film formed on the second base member so that the first bonding film faces the second bonding film; and applying a compressive force to the first base member and the second base member so that the first bonding film and the second bonding film are bonded together to thereby obtain the bonded body;

wherein in the applying process of the compressive force, when the compressive force to be applied to the first base member and the second base member is 50 MPa, a time of applying the compressive force to the first base member and the second base member is defined as "Y" minutes, a temperature of heating the first bonding film and the second bonding film is defined as "T" K, the amount of copper contained in each of the first bonding film and the second bonding film is defined as "X" atom %, and a gas constant is defined as "R" J/(mol·K), the following relation is satisfied:

$$1/Y \geq 1.43 \times 10^9 \exp[-6.60 \times 10^{-2}(100-X) - 82 \times 10^3/RT].$$

2. The method as claimed in claim 1, wherein in the forming processes of the first bonding film and the second bonding film, each of the first bonding film and the second bonding film is formed so that its surface roughness Ra according to JIS B 0601 is in the range of 1 to 30 nm.

3. The method as claimed in claim 1, wherein in the applying process of the compressive force, a time of applying the compressive force to the first base member and the second base member is in the range of 5 to 180 minutes.

4. The method as claimed in claim 1, wherein in the applying process of the compressive force, the first bonding film and the second bonding film are heated.

5. The method as claimed in claim 4, wherein a temperature of heating the first bonding film and the second bonding film is in the range of 90 to 200° C.

6. The method as claimed in claim 1, wherein the applying process of the compressive force is carried out in an air atmosphere.

7. The bonding method as claimed in claim 1, wherein the forming processes of the first bonding film and the second bonding film are carried out by using a metal organic chemical vapor deposition method in which an organic metal material constituted of copper and the organic component is used as a raw material.

8. The method as claimed in claim 7, wherein the organic metal material includes an organic copper complex.

9. The method as claimed in claim 7, wherein a part of the organic component constituting the organic metal material remains in the first bonding film and the second bonding film.

10. The method as claimed in claim 1, wherein an average thickness of each of the first bonding film and the second bonding film is in the range of 1 to 1,000 nm.

11. The method as claimed in claim 1, wherein each of the first base member and the second base member has a plate shape.

12. The method as claimed in claim 1, wherein the first base member and the second base member have a region on which the first bonding film and the second bonding film are formed, respectively, and at least the region of each of the first base member and the second base member is constituted of a silicon material, a metal material or a glass material as a main component thereof.

13. The method as claimed in claim 1, wherein the first base member and the second base member have a surface on which the first bonding film and the second bonding film are formed, respectively, and the surface of each of the first base member and the second base member is preliminarily subjected to a surface treatment to improve bonding strength between the first base member and the first bonding film and bonding strength between the second base member and the second bonding film.

14. The method as claimed in claim 13, wherein the surface treatment is a plasma treatment.

15. The method as claimed in claim 1, wherein the bonded body is further comprised of intermediate layers, and the intermediate layers are formed between the first base member and the first bonding film and between the second base member and the second bonding film, respectively.

16. The method as claimed in claim 15, wherein the intermediate layers are constituted of an oxide-based material as a main component thereof.

* * * * *